(12) United States Patent
Zhang et al.

(10) Patent No.: US 10,529,900 B2
(45) Date of Patent: Jan. 7, 2020

(54) SOLID STATE LIGHTING DEVICE PROVIDING SPECTRAL POWER DISTRIBUTION WITH ENHANCED PERCEIVED BRIGHTNESS

(71) Applicant: IDEAL Industries Lighting LLC, Sycamore, IL (US)

(72) Inventors: Fan Zhang, Goleta, CA (US); Ryan Gresback, Santa Barbara, CA (US); James Ibbetson, Santa Barbara, CA (US); Bernd Keller, Santa Barbara, CA (US); Antony Paul Van De Ven, Hong Kong (HK)

(73) Assignee: IDEAL Industries Lighting LLC, Sycamore, IL (US)

( * ) Notice: Subject to any disclaimer, the term of this patent is extended or adjusted under 35 U.S.C. 154(b) by 0 days.

(21) Appl. No.: 15/972,152

(22) Filed: May 5, 2018

(65) Prior Publication Data
US 2019/0341531 A1    Nov. 7, 2019

(51) Int. Cl.
*H05B 37/00* (2006.01)
*H05B 33/08* (2006.01)
(Continued)

(52) U.S. Cl.
CPC ............ *H01L 33/504* (2013.01); *H01L 33/08* (2013.01)

(58) Field of Classification Search
CPC .. F21K 9/233; F21Y 2115/10; F21Y 2113/13; H05B 33/0866; H05B 33/0857; H05B 37/0218; H01L 2924/00014; H01L 2924/12044; H01L 2224/48247; H01L 2933/0041; H01L 33/504; H01L 33/502; H01L 33/325; H01L 25/167; H01L 2224/48237
See application file for complete search history.

(56) References Cited

U.S. PATENT DOCUMENTS

| | | |
|---|---|---|
| 6,600,175 B1 | 7/2003 | Baretz et al. |
| 8,018,135 B2 | 9/2011 | Van De Ven et al. |
| | (Continued) | |

OTHER PUBLICATIONS al Enezi, J., et al., "A "Melanopic" Spectral Efficiency Function Predicts the Sensitivity of Melanopsin Photoreceptors to Polychromatic Lights," Journal of Biological Rhythms, vol. 26, No. 4, Aug. 2011, pp. 314-323.

(Continued)

*Primary Examiner* — Caridad Everhart
(74) *Attorney, Agent, or Firm* — Withrow & Terranova, P.L.L.C.

(57) ABSTRACT

A solid state lighting device includes at least one electrically activated solid state light emitter configured to stimulate emissions of first through third lumiphoric materials having peak wavelengths in ranges of from 485 nm to 530 nm, from 575 nm to 595 nm, and from 605 nm to 640 nm, respectively (or subranges thereof defined herein), with the third peak having a full width half maximum value of less than 60 nm. The resulting device generates aggregated emissions having a suitably high color rendering index (e.g., CRI Ra) value (e.g., at least 70), and also having a spectral power distribution with a Melanopic/Photopic ratio within a specified target range as a function of correlated color temperature, thereby providing increased perceived brightness.

20 Claims, 23 Drawing Sheets

(51) Int. Cl.
*H01L 33/50* (2010.01)
*H01L 33/08* (2010.01)

(56) References Cited

U.S. PATENT DOCUMENTS

| | | | |
|---|---|---|---|
| 8,814,621 | B2 | 8/2014 | Siebel, II |
| 9,159,888 | B2 | 10/2015 | Chitnis et al. |
| 2005/0184638 | A1* | 8/2005 | Mueller ............ C09K 11/0883 313/485 |
| 2009/0261710 | A1 | 10/2009 | Zukauskas et al. |
| 2011/0273079 | A1 | 11/2011 | Pickard et al. |
| 2016/0223146 | A1* | 8/2016 | Vick ........................ F21K 9/64 |
| 2016/0372638 | A1 | 12/2016 | Todorov et al. |
| 2017/0354000 | A1 | 12/2017 | Gordin et al. |

OTHER PUBLICATIONS

Berman, S. M., et al., "Photopic luminance does not always predict perceived room brightness," Lighting Research & Technology, vol. 22, Issue 1, Mar. 1, 1990, pp. 37-41.

Brown, T. M., et al., "The Melanopic Sensitivity Function Accounts for Melanopsin-Driven Responses in Mice under Diverse Lighting Conditions," PLoS One, vol. 8, Issue 1, Article No. e53583, Jan. 2013, 8 pages.

Lucas, R. J., et al., "Measuring and using light in the melanopsin age," Trends in Neurosciences, vol. 37, No. 1, Jan. 2014, pp. 1-9.

Philips, "Evaluating Light Output: Using Delivered Light to Specify and Compare LED Lighting Fixtures," Technical Brief, Philips Color Kinetics, Available online at: <<http://www.colorkinetics.com/Learn/docs/Evaluating_Light_Output.pdf>>, 2010, 12 pages.

Rea, MS, et al., "Toward a model of outdoor lighting scene brightness," Lighting Research & Technology, vol. 43, Issue 1, Published online Jun. 8, 2010, pp. 7-30.

Rea, MS, et al., "Spectral considerations for outdoor lighting: Designing for perceived scene brightness," Lighting Research & Technology, vol. 47, Issue 8, Published online Oct. 23, 2014, pp. 909-919.

Rea, MS, et al., "Parking lot lighting based upon predictions of scene brightness and personal safety," Lighting Research & Technology, vol. 49, Issue 3, Published online Sep. 2, 2015, pp. 1-12.

Royer, M. P., et al., "Spatial Brightness Perception of Trichromatic Stimuli," LEUKOS the Journal of the Illuminating Engineering Society of North America, vol. 9, No. 2, Oct. 2012, pp. 89-108.

Schlesselman, B., et al., "Melanopsin richer photopically metameric lights experienced in a simulated sports field environment are perceived as relatively brighter," 31st International Pupil Colloquium, Sep. 13-17, 2015, Pembroke College, University of Oxford, Pembroke Square, Oxford OX1 1DW (Abstract only—p. 11).

Schlesselman, B., et al., "Melanopic Richer Metameric Lightings Experienced in a Simulated Sports Field are Perceived as Relatively Brighter," PowerPoint Presentation, 2016, 78 pages.

Schlesselman, B., et al., "Melanopsin, True Brightness, and the Recalibration of Light Meters," PowerPoint Presentation, 2016, 59 pages.

Sharpe, L. T., et al., "A luminous efficiency function, $V^*(\lambda)$, for daylight adaptation," Journal of Vision, vol. 5, Dec. 21, 2005, pp. 948-968.

International Search Report and Written Opinion for International Patent Application No. PCT/US2019/030626, dated Jul. 26, 2019, 22 pages.

\* cited by examiner

| Survey | Booth setup | Spectra source | LF/blueW (lm/W) (in EZW) | MPB model (Musco) | $V(l)_{10°}$ | Experimental results (subject tests) | Perceived brightness per W (in EZW) | M/P ratio |
|---|---|---|---|---|---|---|---|---|
| All | | 70CRI POR Reference | 269.4 | | | | | 0.463 |
| 1st | | High PB w/o NBR ~70CRI | 254.7 (-5.5%) | 5.3% | 2% | 3.7% | -2.0% | 0.587 |
| 2nd | Unfilled | High PB w/ NBR ~78CRI | 201.6 (-25.2%) | 18% | ~6% | 10.9-11.4% | -17.0 ~ -16.6% | 0.776 |
| 4th | | High PB w/ NBR (low lux) ~78CRI | 201.6 (-25.2%) | 18% | ~6% | 9.6-11.2% | -18.0 ~ -16.8% | 0.769 |
| 3rd | | High PB w/ NBR (105% MPB%) 45CRI | 172.5 (-36.0%) | 26.5% | ~10% | 21.0% (21.2%) | -22.4% | 0.961 |
| 5th | Unfilled and filled | EZW w/ NBR 90CRI (90% MPB%) | 259.7 (-3.6%) | 8.4% | 2% | 6.4~7.7% | +2.6 ~ +3.8% | 0.596 |

FIG. 6A

| Survey | Booth setup | Spectra source | LF/blueW (lm/W) (in EZW) | MPB model (Musco) | $V(l)_{10°}$ | Experimental results (subject tests) | Perceived brightness per W (in EZW) | M/P ratio |
|---|---|---|---|---|---|---|---|---|
| 6th | Filled | 80CRI POR Reference | 250.1 | | | | | 0.535 |
| | | High PB w/NBR ~78CRI | 201.6 (-19.4%) | 12.6% | 4.6% | 7.1% | -13.7% | 0.790 |

*FIG. 6B*

| duv | CCT | CRI | MP ratio |
|---|---|---|---|
| "2B" (+0.004) | 5995 | 69.7 | 1.13 |
| "2A" (-0.004) | 5978 | 69.9 | 1.10 |

SOLID STATE LIGHTING DEVICE PROVIDING SPECTRAL POWER DISTRIBUTION WITH ENHANCED PERCEIVED BRIGHTNESS

TECHNICAL FIELD

The present disclosure relates to solid state lighting devices, including devices with lumiphors arranged to be stimulated by electrically activated solid state emitters, and relates to associated methods of making and using such devices.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials.

Solid state emitters may include lumiphoric materials (also known as lumiphors) that absorb a portion of emissions having a first peak wavelength emitted by the emitter and re-emit light having a second peak wavelength that differs from the first peak wavelength. Phosphors, scintillators, and lumiphoric inks are common lumiphoric materials. Light perceived as white or near-white may be generated by a combination of red, green, and blue ("RGB") emitters, or, alternatively, by combined emissions of a blue LED and a lumiphor such as a yellow phosphor (e.g., YAG:Ce or Ce:YAG). In the latter case, a portion of the blue LED emissions pass through the phosphor, while another portion of the blue emissions is downconverted to yellow, and the blue and yellow light in combination are perceived as white. White light may also be produced by stimulating phosphors or dyes of multiple colors with a violet or UV LED source.

Emissions of a blue LED in combination with a yellow or green lumiphoric material may be near-white in character and referred to as "blue-shifted yellow" ("BSY") light or "blue-shifted green" ("BSG") light. Addition of red (or red-orange) spectral output from a red-emitting LED (to yield a "BSY+R" device) or from a red lumiphoric material (to yield a "BS(Y+R)" device) may be used to increase the warmth of the aggregated light output and better approximate light produced by incandescent lamps.

Color reproduction is commonly measured using Color Rendering Index (CRI) or average Color Rendering Index (CRI Ra). To calculate CRI, the color appearance of 14 reflective samples is simulated when illuminated by a reference radiator (illuminant) and the test source. The general or average color rendering index CRI Ra is a modified average utilizing the first eight indices, all of which have low to moderate chromatic saturation. (R9 is one of six saturated test colors not used in calculating CRI, with R9 embodying a large red content.) CRI and CRI Ra are used to determine how closely an artificial light source matches the color rendering of a natural light source at the same correlated color temperature. Daylight has a high CRI Ra (approximately 100), with incandescent bulbs also being relatively close (CRI Ra greater than 95), and fluorescent lighting being less accurate (with typical CRI Ra values of approximately 70-80).

The reference spectra used in color rendering index calculations were chosen as ideal illumination sources defined in terms of their color temperature. As a heated object becomes incandescent, it first glows reddish, then yellowish, then white, and finally bluish. Thus, apparent colors of incandescing materials are directly related to their actual temperature (in Kelvin (K)). Practical materials that incandesce are said to have correlated color temperature (CCT) values that are directly related to color temperatures of blackbody sources.

Aspects relating to the inventive subject matter disclosed herein may be better understood with reference to the 1931 CIE (Commission International de l'Eclairage) Chromaticity Diagram, which is well-known and of which a copy is reproduced in FIG. 1. The 1931 CIE Chromaticity Diagram maps out the human color perception in terms of two CIE parameters x and y. The spectral colors are distributed around the edge of the outlined space, which includes all of the hues perceived by the human eye. The boundary line represents maximum saturation for the spectral colors. The chromaticity coordinates (i.e., color points) that lie along the blackbody locus ("BBL") (also known as the Planckian locus) obey Planck's equation: $E(\lambda)=A\lambda^{-5}/(e^{B/T}-1)$, where E is the emission intensity, $\lambda$ is the emission wavelength, T the color temperature of the blackbody, and A and B are constants. Color coordinates that lie on or near the blackbody locus (which embodies a curved line emanating from the right lower corner) yield pleasing white light to a human observer. The 1931 CIE Diagram includes temperature listings along the blackbody locus, with these temperature listings showing the color path of a blackbody radiator that is caused to increase to such temperatures. As a heated object becomes incandescent, it first glows reddish, then yellowish, then white, and finally bluish. This occurs because the wavelength associated with the peak radiation of the blackbody radiator becomes progressively shorter with increased temperature, consistent with the Wien Displacement Law. Illuminants which produce light that is on or near the blackbody locus can thus be described in terms of their color temperature. The white area proximate to (i.e., within approximately a MacAdam eight-step ellipse of) of the BBL and between 2,500 K and 10,000 K, is shown in FIG. 1.

The term "white light" or "whiteness" does not clearly cover the full range of colors along the BBL since it is apparent that a candle flame and other incandescent sources appear yellowish, i.e., not completely white. Accordingly, the color of illumination may be better defined in terms of correlated color temperature (CCT) and in terms of its proximity to the BBL. The pleasantness and quality of white illumination decreases rapidly if the chromaticity point of the illumination source deviates from the BBL by a distance of greater than 0.01 in the x, y chromaticity system. This corresponds to the distance of about a MacAdam four-step ellipse, a standard employed by the lighting industry. A lighting device emitting light having color coordinates that are within a MacAdam four-step ellipse of the BBL and that has a CRI Ra>80 is generally acceptable as a white light for general illumination purposes. A lighting device emitting light having color coordinates within a MacAdam seven- or eight-step ellipse of the BBL and that has a CRI Ra>70 is used as the minimum standards for many other white lighting devices including compact fluorescent and solid state lighting devices. FIG. 2 illustrates MacAdam 2-step, 4-step, and 7-step ellipses for a CCT of 3200K relative to a segment of the BBL (e.g., extending generally between 2900K and 3500K).

Quality artificial lighting generally attempts to emulate the characteristics of natural light. Natural light sources include daylight with a relatively high color temperature (e.g., ~5000K) and incandescent lamps with a lower color temperature (e.g., ~2800K). General illumination generally has a color temperature between 2,000 K and 10,000 K, with the majority of lighting devices for general illumination being between 2,700 K and 6,500 K. The white area proximate to (i.e., within approximately a MacAdam eight-step ellipse of) of the BBL and between 2,500 K and 10,000 K, is shown in FIG. 1.

Luminous efficacy is a measure of how well a light source produces visible light, and represents the ratio of luminous flux to power (with the power being either radiant flux or total power consumed by a source, depending on the context). Wavelengths of light outside of the visible spectrum are not useful for illumination because they cannot be seen by the human eye. Moreover, the human eye exhibits greater response to some wavelengths of light than to others, even within the visible spectrum. Response of the human eye to light also varies with respect to the level of intensity of light.

At the back of the eye, the retina contains millions of light receptors that convert light into electrified signals that are sent to vision centers of the brain. The retina contains two major categories of photoreceptors called cones and rods because of their geometric shapes. The very central part of the retina, called the fovea, contains only cones. The rest of the retina is populated with both rods and cones, with the number of rods exceeding the number of cones by a ratio of about 10 to 1.

Three visual states that depend on the level of illuminance are photopic vision, scotopic vision, and mesopic vision. Photopic vision is the vision of the eye under well-lit conditions. In humans and many other animals, photopic vision is mediated by cone cells, and allows color perception and significantly higher visual acuity than available with scotopic vision. The human eye uses three types of cones (with biological pigments having maximum absorption values at wavelengths of about 420 nm (blue), 534 nm (bluish-green), and 564 nm (yellowish green)) to sense light in three bands of color, providing maximum efficacy of about 683 lm/W at a wavelength of 555 nm (in the green-yellow part of the visible light spectrum). Scotopic vision is the vision of the eye under very low light (e.g., nearly dark) conditions, in which much color discernment is lost. In the human eye, cone cells are nonfunctional in low light; as a result, scotopic vision is produced exclusively through rod cells, which are most sensitive to wavelengths of light around 498 nm (green-blue) and are not sensitive to wavelengths longer than about 640 nm (red). Mesoptic vision occurs at illuminance levels between those of photopic and scotopic vision. In particular, scotopic vision occurs at luminance levels of $10^{-2}$ to $10^{-6}$ cd/m$^2$; photopic vision occurs at luminance levels of 1 to $10^6$ cd/m$^2$ (normal light); and mesopic vision occurs in intermediate lighting conditions (luminance levels of $10^{-2}$ to 1 cd/m$^2$). Mesoptic vision is effectively a combination of scotopic and photopic vision, but yields less accurate visual acuity and color discrimination.

FIG. 3 illustrates scotopic and photopic luminosity functions, with the leftmost curve embodying a scotopic luminosity function (as adopted by the Commission Internationale de l'Éclairage (CIE) in 1951), and with the rightmost curve embodying a photopic luminosity functions (wherein the solid line represents the CIE 1931 standard). The CIE 1931 photopic luminosity function also forms the central color matching function in the CIE 1931 color space. As shown in FIG. 3, the scotopic curve exhibits significant response above 420 nm, a peak at 507 nm, and very little response above 600 nm, whereas the photopic curve exhibits very limited response below 450 nm, a peak at 555 nm, and still-significant response above 650 nm before declining to zero response around 700 nm. For everyday light levels, the photopic luminosity function best approximates the response of the human eye; however, for low light levels, the response of the human eye changes, and the scotopic luminosity function applies. This difference in the scotopic and photopic luminous efficacy of the source results from the shift of eye sensitivity function peaking at 555 nm (under photopic lighting conditions) to 507 nm (under scotopic lighting conditions), also known as the Purkinje shift.

Historically, lighting manufacturers have utilized light meters to determine a lamp's lumen output that are calibrated by examining the eye's sensitivity to only cone activated vision in the very central part of the retina, the fovea, while ignoring the effect of rod activated vision. As a result, traditional lighting practice accepted a single sensitivity function based on the assumption that the more light sensitive rods only functioned at very dim light levels. More recent studies have demonstrated that rod photoreceptors are active not only in dim light but also at typical interior light levels as well.

Since rods are more sensitive than cones to bluish-white light sources characteristic of higher correlated color temperature (CCT) values, an environment lit with a light source having a higher CCT value (e.g., 5000K or above) may appear brighter than the same environment lit with a light source having a lower CCT value (e.g., warm white (3000K) and cool white (4100K) lamps such as fluorescent tubes). Light having a higher CCT value yields relatively smaller pupils at a given photopic light level, so that object light rays are collected more at the central region of the eye, which may result in improved optical vision. Despite this, adjustment of CCT alone is not sufficient to optimize human-perceived brightness in a given environment. Moreover, light having moderately to very high CCT values may not be pleasing to some observers.

It has been recently recognized that photosensitive retinal ganglion cells expressing the photopigment melanopsin is involved not only in circadian photoentrainment, but also in perceived brightness of light. Melanopsin photoreceptors are sensitive to a range of wavelengths and reach peak light absorption at blue light wavelengths around 480 nm. A "melanopic" spectral efficiency function has been determined to predict the sensitivity of melanopsin photoreceptors to polychromatic lights.

Despite the potential for increasing perceived brightness using lamps with increased melanopic content (e.g., spectral content at or near 480 nm), it is not straightforward to make such a light source with sufficient levels of color rendering (e.g., to enable color differentiation).

Accordingly, the art continues to seek improved solid state lighting devices that provide desirable illumination characteristics and are capable of overcoming challenges associated with conventional lighting devices.

SUMMARY

The present disclosure relates in various aspects to solid state (e.g., LED) lighting devices including at least one electrically activated (e.g., blue light emitting) solid state light emitter configured to stimulate emissions of multiple lumiphoric materials having different peak wavelengths, with the lighting device providing aggregated emissions having a suitably high color rendering index (e.g., CRI Ra) value (e.g., at least 70, 80, 85, or 90 in certain embodiments), and also having a spectral power distribution with a Melanopic/Photopic ratio (M/P ratio) within a specified target range as a function of correlated color temperature. At least one lumiphoric material includes a relatively narrow peak width (e.g., expressed in terms of a full width half maximum value or "FWHM"). The specified M/P ratio target range is believed to be greater than attained with conventional lighting devices including multiple lumiphoric materials stimulated by at least one blue solid state light emitter.

In one aspect, the present disclosure relates to a lighting device including at least one electrically activated solid state light emitter arranged to generate emissions having a peak wavelength in a blue range; and first through third lumiphoric materials arranged to receive at least a portion of emissions of the at least one electrically activated solid state light emitter and configured to responsively generate lumiphor emissions. Lumiphor emissions of the first through third lumiphoric materials have peak wavelengths in three ranges. In particular, lumiphor emissions of the first lumiphoric material have a first peak wavelength in a range of from 485 nm to 530 nm (or a subrange thereof specified herein); lumiphor emissions of the second lumiphoric material have a second peak wavelength in a range of from 575 nm to 612 nm (or a subrange thereof specified herein); and lumiphor emissions of the third lumiphoric material having a third peak wavelength in a range of from 605 nm to 640 nm (or a subrange thereof specified herein). The third peak wavelength further corresponds to a third peak having a full width half maximum value of less than 60 nm (or less than 35 nm in certain embodiments). Aggregated emissions of the lighting device include emissions of the at least one electrically activated solid state light emitter as well as the first through third lumiphoric materials. Aggregated emissions of the lighting device have a CRI Ra value of at least 70 (or another threshold specified herein), and also have a spectral power distribution with a Melanopic/Photopic (M/P ratio) value within a target range as a function of correlated color temperature (CCT) in Kelvin. The target range includes minimum values defined by a minimum value function in which M/P ratio equals $[-2.05\times10^{-8}(CCT)^2+2.72\times10^{-4}(CCT)-0.1506]$. Preferably, the target range also includes maximum values defined by a maximum value function in which M/P ratio equals $[-2.57\times10^{-8}(CCT)^2+3.70\times10^{-4}(CCT)-0.1889]$, and CCT being in a range of from 2000 to 7000 Kelvin.

In certain embodiments, the lighting device includes aggregated emissions having a spectral power distribution with a Melanopic/Photopic ratio (M/P ratio) value within a first target subrange as a function of CCT in Kelvin of the aggregated emissions, the first target subrange including minimum values defined by a minimum value function in which M/P ratio equals $[-2.05\times10^{-8}(CCT)^2+2.72\times10^{-4}(CCT)-0.1506]$ the first target subrange including maximum values defined by a maximum value function in which M/P ratio equals $[-2.57\times10^{-8}(CCT)^2+3.70\times10^{-4}(CCT)-0.1889]$, and CCT being in a range of from 2000 to 7000 Kelvin.

In certain embodiments, the lighting device includes aggregated emissions having a spectral power distribution with a Melanopic/Photopic ratio (M/P ratio) value within a second target subrange as a function of CCT in Kelvin of the aggregated emissions, the second target subrange including minimum values defined by a minimum value function in which M/P ratio equals $[-2.05\times10^{-8}(CCT)^2+2.72\times10^{-4}(CCT)-0.1506]$ the second target subrange including maximum values defined by a maximum value function in which M/P ratio equals $[-2.57\times10^{-8}(CCT)^2+3.70\times10^{-4}(CCT)-0.1889]$ and CCT being in a range of from 2000 to 7000 Kelvin.

In certain embodiments, CCT of the aggregated emissions is in a range of from 2000 to 6000 Kelvin.

In certain embodiments, the second peak wavelength (i.e., in a range of from 575 nm to 612 nm, or a subrange of from 575 nm to 595 nm, or a subrange of from 580 nm to 590 nm, or any subrange thereof disclosed herein) corresponds to a second peak having a full width half maximum value of less than 60 nm (or less than 35 nm in certain embodiments).

In certain embodiments, the aggregated emissions define a color point within a ±10 step MacAdam ellipse (or within a ±7step MacAdam ellipse) of a Planckian Locus on a CIE 1931 chromaticity diagram.

In certain embodiments, the at least one electrically activated solid state light emitter has a peak wavelength in a range of from 430 nm to 480 nm, or within a range of from 440 nm to 460 nm.

In certain embodiments, the at least one electrically activated solid state light emitter comprises a plurality of electrically activated solid state light emitters.

In certain embodiments, lumiphor emissions of the first lumiphoric material have a first peak wavelength in a subrange of from 490 nm to 500 nm. In certain embodiments, lumiphor emissions of the second lumiphoric material have a second peak wavelength in a subrange of from 575 nm to 595 nm, or a subrange of from 580 nm to 590 nm. In certain embodiments, lumiphor emissions of the third lumiphoric material have a third peak wavelength is in a subrange of from 610 nm to 625 nm. In certain embodiments, the third peak wavelength corresponds to a third peak having a full width half maximum value of less than 35 nm.

In certain embodiments, aggregated emissions of the lighting device have a CRI Ra value of at least 80, or in a range of from 70 to 95, or in a range of from 75 to 95, or in a range of from 70 to 90.

In certain embodiments, the first through third lumiphoric materials are dispersed in a binder. In certain embodiments, the first lumiphoric material is arranged in a first layer, the second lumiphoric material is arranged in a second layer, and the third lumiphoric material is arranged in a third layer.

In another aspect, the present disclosure relates to a lighting device including at least one electrically activated solid state light emitter arranged to generate emissions having a peak wavelength in a blue range; at least one supplemental electrically activated solid state light emitter; and a plurality of lumiphoric materials arranged to receive at least a portion of emissions of the at least one electrically activated solid state light emitter and configured to responsively generate lumiphor emissions. Aggregated emissions of the lighting device include emissions of the at least one electrically activated solid state light emitter, emissions of the at least one supplemental electrically activated solid state light emitter, and emissions of the plurality of lumiphoric materials. Aggregated emissions of the lighting device include a first peak wavelength in a range of 430 nm to 480 nm, a second peak wavelength in a range of from 485 nm to 530 nm, a third peak wavelength in a range of from 575 nm to 612 nm, and a fourth peak wavelength in a range of from 605 nm to 640 nm, and the fourth peak wavelength corresponds to a peak having a full width half maximum value of less than 60 nm. Aggregated emissions of the lighting device have a CRI Ra value of at least 70 (or another threshold specified herein), and also have a spectral power distribution with a Melanopic/Photopic ratio (M/P ratio) value within a target range as a function of correlated color temperature (CCT) in Kelvin. The target range includes minimum values defined by a minimum value function in which M/P ratio equals $[-2.05 \times 10^{-8}(CCT)^2 + 2.72 \times 10^{-4}(CCT) - 0.1506]$. Preferably, the target range also includes maximum values defined by a maximum value function in which M/P ratio equals $[-2.57 \times 10^{-8}(CCT)^2 + 3.70 \times 10^{-4}(CCT) - 0.1889]$, and CCT being in a range of from 2000 to 7000 Kelvin. In certain embodiments, the at least one supplemental electrically activated solid state light emitter is configured to generate the second peak wavelength or the fourth peak wavelength. In certain embodiments, the second peak wavelength is in a subrange of from 485 nm to 505 nm, the third peak wavelength is in a subrange of from 575 nm to 595 nm.

In another aspect, the present disclosure relates to a method comprising illuminating an object, a space, or an environment, utilizing a solid state lighting device as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the present disclosure will be more fully apparent from the ensuing disclosure and appended claims.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 6A is a table including results of first through fifth booth surveys utilizing side-by-side illuminated booths to compare spectral outputs of multiple purported high perceived brightness lumiphor converted LED-based light sources (each including a different phosphor blend) to a 70 CRI reference lumiphor converted LED light source.

FIG. 6B is a table identifying results of a sixth booth survey utilizing side-by-side illuminated booths to compare a 78 CRI LED-based light source to an 80 CRI reference lumiphor converted LED light source.

DETAILED DESCRIPTION

Figure 1:
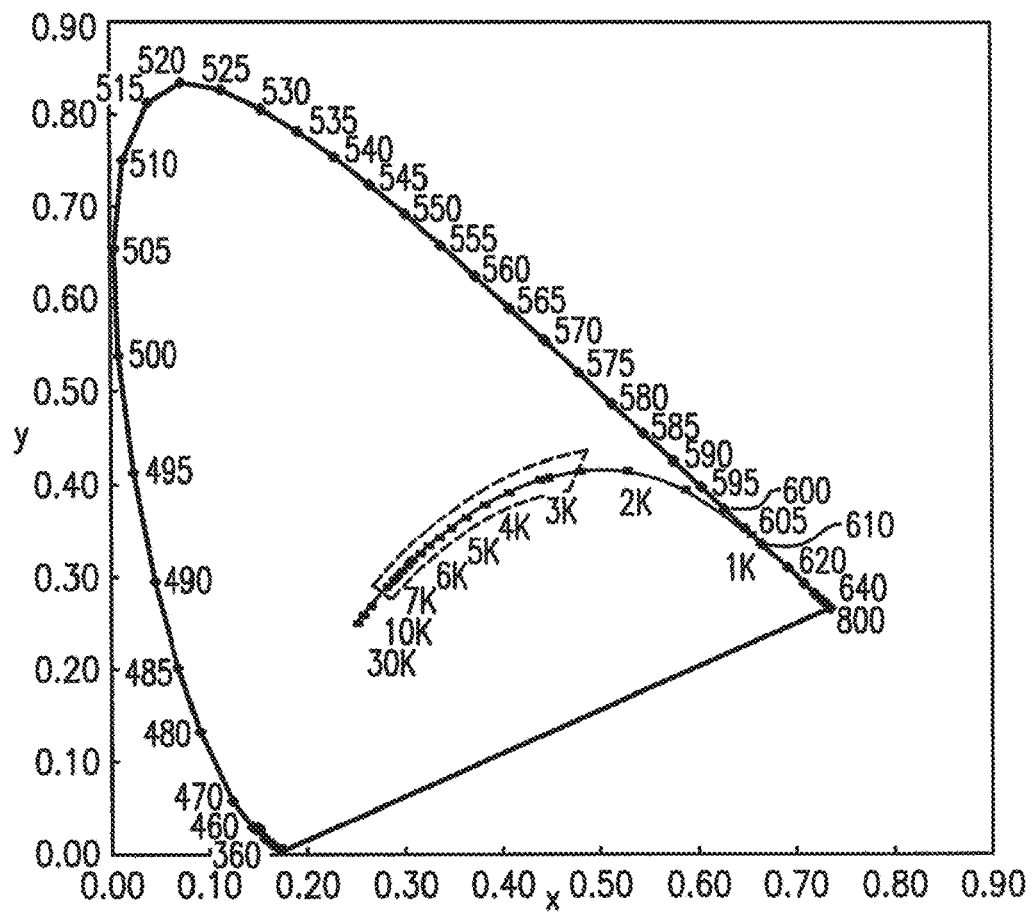
FIG. 1 is a 1931 CIE Chromaticity Diagram with identification of a white area proximate to (i.e., within approximately a MacAdam eight-step ellipse of) of the blackbody or Planckian locus, and identification of correlated color temperature values ranging from 1,000 to 30,000 K.
Figure 2:
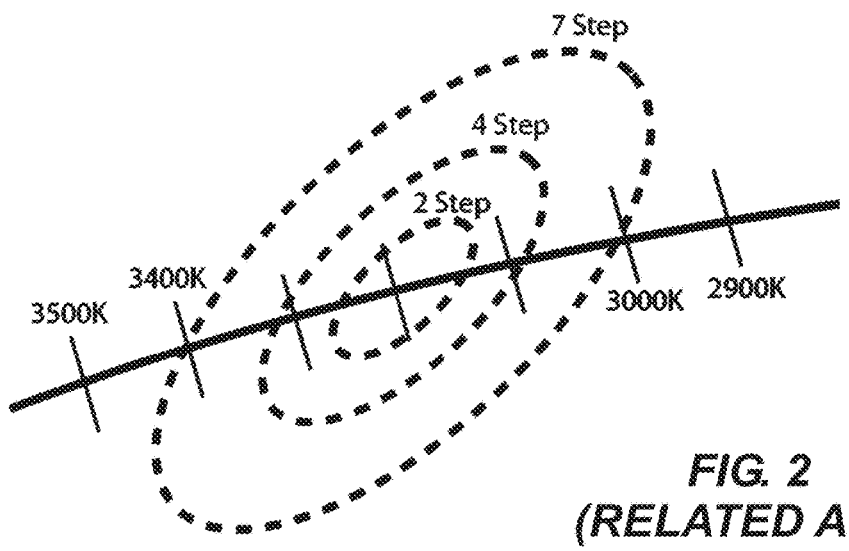
FIG. 2 illustrates MacAdam 2-step, 4-step, and 7-step ellipses for a CCT of 3200K relative to a segment of the BBL.
Figure 3:
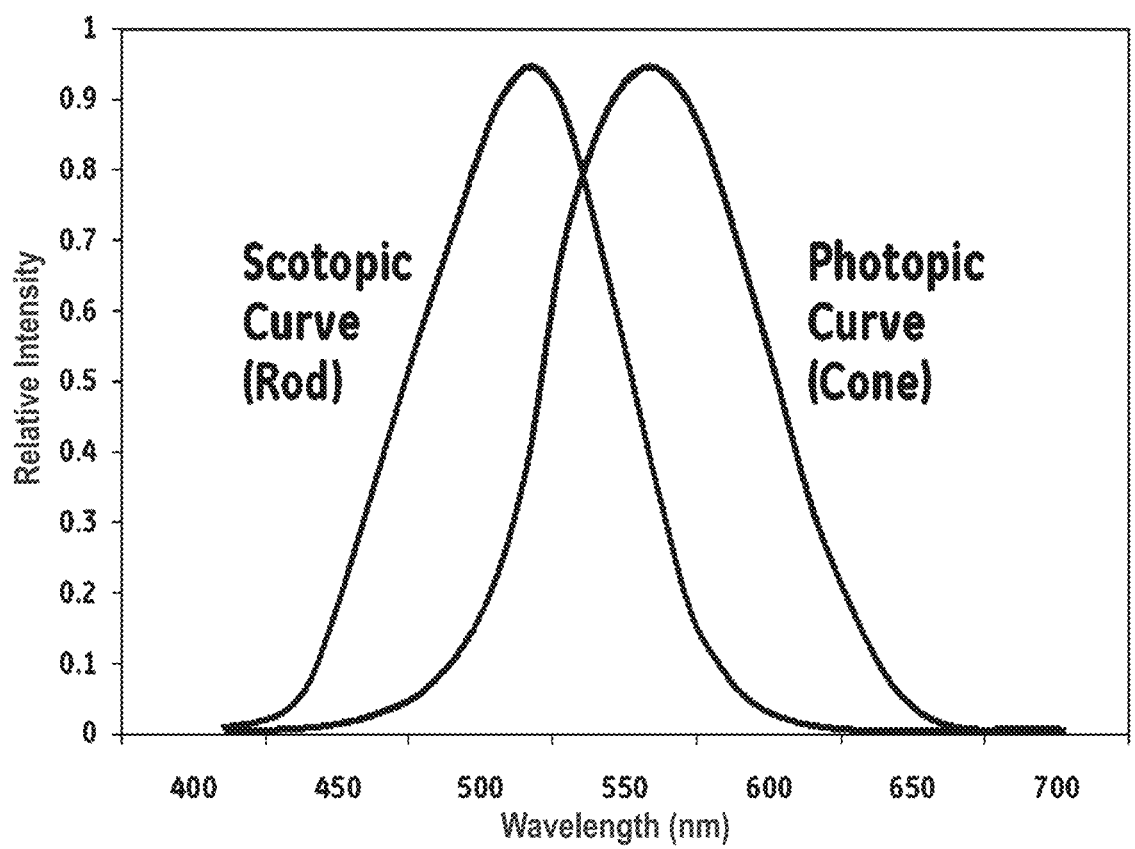
FIG. 3 provides plots of the scotopic and photopic luminosity functions expressed in relative intensity versus wavelength.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

As noted previously, the art continues to seek solid state lighting devices providing desirable illumination characteristics. Brightness of illumination provided by a light source has traditionally focused on measurement of lumen output, without accurately representing perceived brightness in real-world settings taking into account perception of human viewers.

Various embodiments disclosed herein relate to lighting devices capable of providing light with enhanced perceived brightness, in combination with acceptably light quality (e.g., color fidelity, which may be expressed as CRI or CRI Ra). Perceived brightness may be enhanced by increasing spectral content at or near the melanopic spectral efficiency peak of 480 nm, while providing amber/orange-red or short wavelength red content (e.g., having a peak wavelength in a range of from 575 nm to 612 nm, or 575 nm to 595 nm, or 580 nm to 590 nm) in combination with narrow-band red content (e.g., having a peak wavelength in a range of from 605 nm to 640 nm, corresponding to a peak having a full width half maximum value of less than 60 nm (or less than 35 nm)) facilitate attainment of a desired color target for aggregated emissions and attainment of color quality requirements (e.g., CRI Ra value of at least 70, or another threshold or range identified herein). Use of at least one narrow-band emitting lumiphoric material may beneficially increase perceived brightness and efficacy of aggregated emissions of a lighting device.

In certain embodiments, one of the spectral peaks mentioned above may be provided by a supplemental (e.g., cyan, green, amber/orange, or red) electrically activated solid state light emitter (e.g., an LED) instead of a lumiphoric material.

More specific aspects of the disclosure will be described after terms are defined and general concepts are introduced.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The terms "solid state light emitter" or "solid state emitter" (which may be qualified as being "electrically activated") may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. Solid state light emitting devices according to embodiments disclosed herein may include, but are not limited to, III-V nitride based LED chips or laser chips fabricated on a silicon, silicon carbide, sapphire, or III-V nitride growth substrate, including (for example) devices manufactured and sold by Cree, Inc. of Durham, N.C.

Solid state light emitters may be used individually or in groups to emit one or more beams to stimulate emissions of one or more lumiphoric materials (e.g., phosphors, scintillators, lumiphoric inks, quantum dots, day glow tapes, etc.) to generate light at one or more peak wavelengths, or of at least one desired perceived color (including combinations of colors that may be perceived as white). Lumiphoric materials may be provided in the form of particles, films, or sheets. Quantum dot materials of various colors are commercially available from QD Vision, Inc. (Lexington, Mass., USA), Nanosys Inc. (Milpitas, Calif., USA), and Nanoco Technologies Ltd. (Manchester, United Kingdom), among others.

Inclusion of lumiphoric (also called "luminescent") materials in lighting devices as described herein may be accomplished by any suitable means, including: direct coating on solid state emitters; dispersal in encapsulant materials arranged to cover solid state emitters; coating on lumiphor support elements (e.g., by powder coating, inkjet printing, or the like); incorporation into diffusers or lenses; and the like. Examples of lumiphoric materials are disclosed, for example, in U.S. Pat. Nos. 6,600,175, 8,018,135, and 8,814,621, and methods for coating light emitting elements with phosphors are disclosed in U.S. Pat. No. 9,159,888, with the foregoing patents being incorporated by reference herein. Other materials, such as light scattering elements (e.g., particles) and/or index matching materials, may be associated with a lumiphoric material-containing element or surface. One or more lumiphoric materials useable in devices as described herein may be down-converting or up-converting, or can include a combination of both types.

Examples of phosphors that may be used according to various embodiments include, without limitation, cerium (III)-doped yttrium aluminum garnet (Ce:YAG or YAG:Ce); yttrium aluminum oxide doped with cerium yttrium aluminum garnet (NYAG); green YAG (GNYAG), lutetium aluminum garnet (LuAG), green aluminate (GAL, including but not limited to GAL535); $(Sr,Ba,Ca)_2$-$xSiO_4$:$Eu_x$ (BOSE, including both BOSE yellow and BOSE green varieties, including for example $(Ba,Sr)_2SiO_4$:$Eu^2$); and CASN ($CaAlSiN_3$:$Eu^{2+}$), and KSF narrowband red ($K_2SiF_6$:$Mn^{4+}$). Further examples include cyan or cyan/green phosphors (e.g., having a peak wavelength in a range of from 485 to 530 nm), red/orange or amber phosphors (e.g., having a peak wavelength in a range of from 575 to 595 nm), and narrowband red phosphors (e.g., having a peak wavelength in a range of from 605 to 640 nm). In certain embodiments, two or more phosphors may be mixed or provided in one or more discrete regions of a single lighting device.

In certain embodiments, at least one lumiphoric material may be spatially segregated ("remote") from and arranged to receive emissions from at least one electrically activated solid state emitter, with such spatial separation reducing thermal coupling between a solid state emitter and lumiphoric material. In certain embodiments, a spatially segregated lumiphor may be arranged to fully cover one or more electrically activated emitters of a lighting device. In certain embodiments, a spatially segregated lumiphor may be arranged to cover only a portion or subset of one or more emitters electrically activated emitters.

In certain embodiments, at least one lumiphoric material may be arranged with a substantially constant thickness and/or concentration relative to different electrically activated emitters. In certain embodiments, one or more lumiphoric materials may be arranged with presence, thickness, and/or concentration that vary relative to different emitters. Multiple lumiphors (e.g., lumiphors of different compositions) may be applied with different concentrations or thicknesses relative to different electrically activated emitters. In one embodiment, lumiphor presence, composition, thickness and/or concentration may vary relative to multiple electrically activated emitters. In certain embodiments, at least one lumiphoric material may be applied to a solid state emitter or a lumiphoric material support surface by patterning, which may be aided by one or more masks.

Various substrates may be used as mounting elements on which, in which, or over which multiple solid state light emitters (e.g., emitter chips) may be arranged or supported (e.g., mounted). Exemplary substrates include printed circuit boards (including but not limited to metal core printed circuit boards, flexible circuit boards, dielectric laminates, and the like) having electrical traces arranged on one or multiple surfaces thereof. A substrate, mounting plate, or other support element may include a printed circuit board (PCB), a metal core printed circuit board (MCPCB), a flexible printed circuit board, a dielectric laminate (e.g., FR-4 boards as known in the art) or any suitable substrate for mounting LED chips and/or LED packages.

In certain embodiments, one or more LED components can include one or more "chip-on-board" (COB) LED chips and/or packaged LED chips that can be electrically coupled or connected in series or parallel with one another and mounted on a portion of a substrate. In certain embodiments, COB LED chips can be mounted directly on portions of substrate without the need for additional packaging.

Certain embodiments may involve use of solid state emitter packages. A solid state emitter package may include at least one solid state emitter chip (more preferably multiple solid state emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be arranged to stimulate one or more lumiphoric materials, which may be coated on, arranged over, or otherwise disposed in light receiving relationship to one or more solid state emitters. At least one lumiphoric material may be arranged to receive emissions of at least some emitters of a plurality of solid state light emitters and responsively emit lumiphor emissions. A lens and/or encapsulant material, optionally including lumiphoric material, may be disposed over solid state emitters, lumiphoric materials, and/or lumiphor-containing layers in a solid state emitter package.

In certain embodiments, a lighting device as disclosed herein (whether or not including one or more LED packages) may include at least one of the following items arranged to receive light from at least one electrically activated solid state light emitter (e.g., LED): a single leadframe arranged to conduct electrical power to the at least one electrically activated solid state light emitter; a single reflector arranged to reflect at least a portion of light emanating from the at least one electrically activated solid state light emitter; a single submount or mounting element supporting the at least one electrically activated solid state light emitter; a single lens arranged to transmit at least a portion of light emanating from the at least one electrically activated solid state light emitter; and a single diffuser arranged to diffuse at least a portion of light emanating from the at least one electrically activated solid state light emitter. In certain embodiments, a lighting device apparatus including multiple electrically activated solid state light emitters may include at least one of the following items arranged to receive light from the multiple emitters: multiple lenses, multiple optical elements, and/or multiple reflectors. Examples of optical elements include, but are not limited to, elements arranged to affect light mixing, focusing, collimation, dispersion, and/or beam shaping.

In certain embodiments, a solid state lighting device (e.g., package) may include a wall or cup (e.g., a reflector cup) defining a cavity, at least one solid state emitter arranged within the cavity, and encapsulant material arranged within the cavity. In certain embodiments, at least one solid state emitter may be arranged over a substrate and at least partially surrounded by a boundary wall (optionally embodying at least one dispensed dam material laterally spaced from the emitter(s)), with an encapsulant material arranged over the emitter(s) and in contact with the at least one boundary wall.

The expressions "lighting device," "light emitting device," and "light emitting apparatus" as used herein are not limited, except that such elements are capable of emitting light. That is, a lighting device or light emitting apparatus can be a device which illuminates an area or volume, e.g., a structure, a swimming pool or spa, a room, a warehouse, an indicator, a road, a parking lot, a vehicle (either interior or exterior), signage (e.g., road signs), a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing incandescent lights, low voltage lights, fluorescent lights, etc.), outdoor lighting, street lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting (work lights, etc.), mirrors/vanity lighting, personal lighting device (e.g., flashlight), or any other light emitting devices. In certain embodiments, lighting devices or light emitting apparatuses as disclosed herein may be self-ballasted. In certain embodiments, a light emitting apparatus may be embodied in a light fixture.

Subject matter herein relates in certain embodiments to a method of illuminating an object, space, or enclosure using at least one lighting device or lighting apparatus as disclosed herein, optionally by energizing a single power line connected to multiple lighting devices and/or by pulse width modulation control of the at least one lighting device or lighting apparatus.

Subject matter herein relates in certain embodiments to an illuminated enclosure (the volume of which can be illuminated uniformly or non-uniformly), comprising an enclosed space and at least one lighting device as disclosed herein, wherein at least one lighting device illuminates at least a portion of the enclosure (uniformly or non-uniformly). Subject matter herein further relates to an illuminated area comprising at least one item selected from among the group consisting of a structure, a swimming pool or spa, a room, a warehouse, an indicator, a road, a parking lot, a vehicle, signage (e.g., road signs), a billboard, a ship, a toy, a mirror, a vessel, an electronic device, a boat, an aircraft, a stadium, a computer, a remote audio device, a remote video device, a cell phone, a tree, a window, a LCD display, a cave, a tunnel, a yard, a lamppost, etc., having mounted therein or thereon at least one lighting device or light emitting apparatus as described herein. Methods include illuminating an object, a space, or an environment, utilizing one or more lighting devices as disclosed herein. In certain embodiments, a lighting apparatus as disclosed herein includes multiple LED components arranged in an array (e.g., a one-dimensional or two-dimensional array).

To compare perceived brightness of different light sources (including sources intended to provided high perceived brightness), surveys were conducted with groups of human subjects (e.g., 14 in number) using a two side-by-side test booths that were subject to being illuminated by different sources. Certain surveys used the booths in an unfilled state (devoid of colored objects, thereby providing a clean comparison for perceived brightness without impact from color saturation and color rendering), and other surveys using the booths being filled with colored objects.

Figure 4:
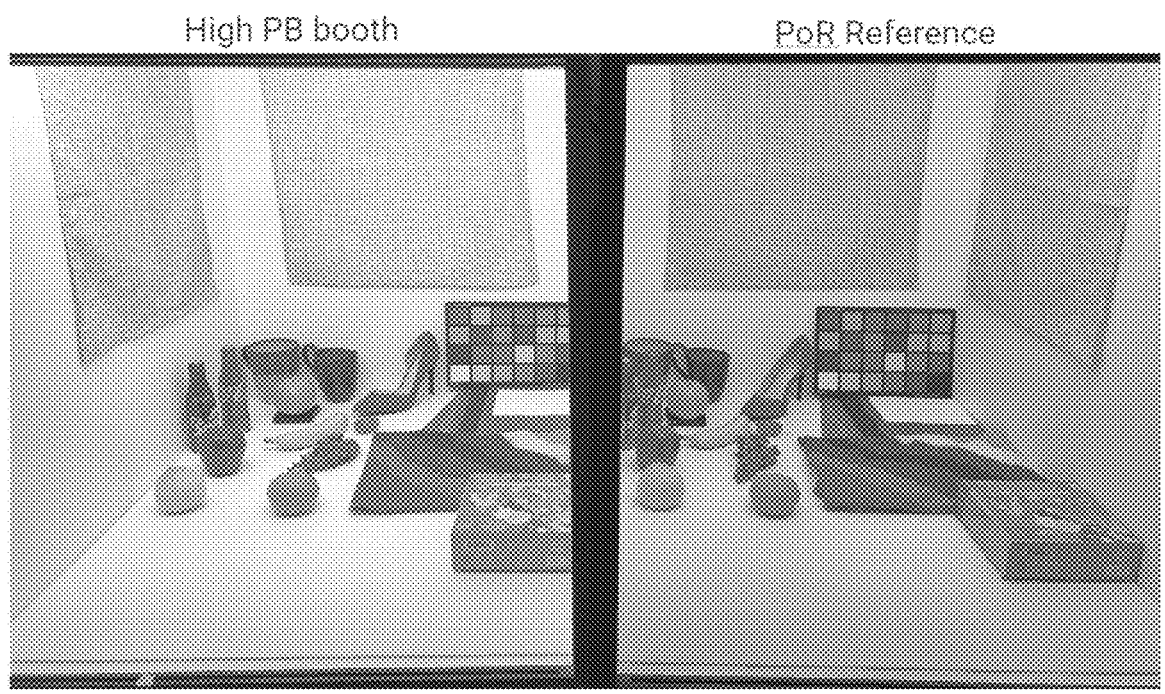
FIG. 4 is a photograph of two side-by-side test booths subject to being illuminated differently, with the booths being in a filled state containing colored objects.

FIG. 4 is a photograph of the test booths in a filled state containing colored objects, with the left booth being subject to illumination with a purported high perceived brightness ("High PB") light source (each including a blue LED and multiple phosphors) and the right booth being subject to illumination with a point of reference ("PoR") 70 CRI light source (including a blue LED configured to stimulate emissions from a YAG phosphor and a short nitride red phosphor). (The actual colors and brightness of two booths are not representative of conditions presented in the surveys.)

In the course of the booth surveys, the 14 subjects were shown the two booths and asked to identify "which side is brighter" each time that conditions were altered. Illuminance of the PoR illuminated booth was modified to a series of 67 different values. Lux was modified over range of ±30% while the High PB illuminated booth was fixed at 900 lux (horizontal illuminance) at a CCT value of about 4000K, and while the subject's observation position was illuminated at a level of about 30 to 100 lx. Over this entire process, the spectral distribution and color point of each source remained constant. Then, the same 14 subjects were asked to adjust illuminance of the PoR illuminated booth to match the brightness of the High PB illuminated booth. Three repeats were performed at different starting lux levels of the PoR illuminated booth (i.e., 100%, 70%, and 130% of the High PB illuminated booth lux), while spectral and color point of each source remained constant.

The High PB light sources included different amounts of cyan/green phosphors relative to one another, as well as different amounts of amber or red/orange phosphors (and different amounts of red phosphors). A ratio of cyan/amber phosphors was 0.29 in the first booth survey, 0.66 in the second and fourth booth surveys, and 1.4 in the third booth survey. The first through fourth booth surveys each utilized a source having a blue LED arranged to stimulate a cyan phosphor (having a peak wavelength of 495 nm), an amber phosphor (having a peak wavelength of 584 nm), and a red phosphor. The second through fourth booth surveys each used a narrowband red KSF phosphor, while the first booth survey omitted the narrowband red KSF phosphor entirely. The fifth booth survey utilized a source having a blue LED arranged to stimulate a green YAG (GNYAG) phosphor (having a peak wavelength of about 526 nm), a short nitride red phosphor, and a narrowband red KSF phosphor.

Figure 5:
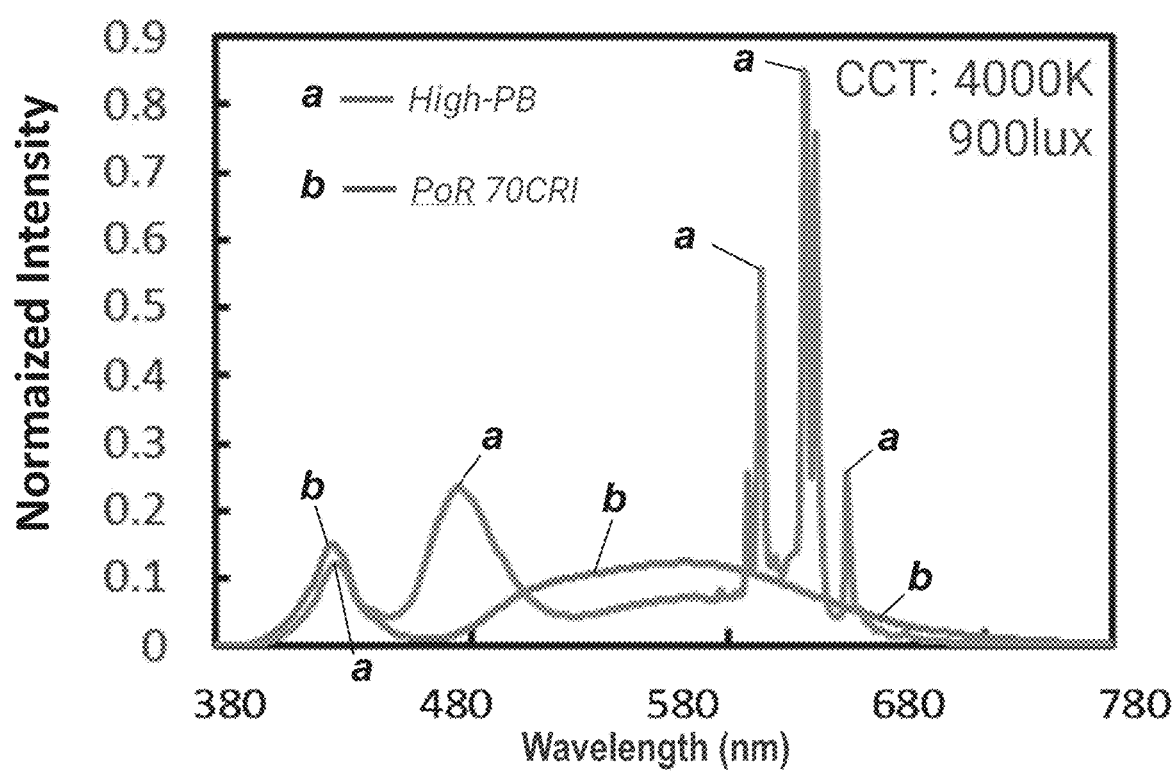
FIG. 5 provides spectral power distribution plots (in normalized intensity versus wavelength) for two light sources, namely: a high perceived brightness ("High PB") light source (e.g., according to the third booth survey described hereinafter), and a point of reference ("PoR") 70 CRI light source, both at a CCT of 4000K and at 900 lux.

FIG. 5 provides spectral power distribution plots (in normalized intensity versus wavelength) for two light sources, namely: a High PB light source (according to the third booth survey), and a point of reference ("PoR") 70 CRI light source, both at a CCT of 4000K and at 900 lux. As shown, the High PB light source exhibits a significant peaks near 480 nm and near 600 nm that are absent from the PoR light source.

A number of brightness models have been proposed by the lighting-science community (including, for example, in Lighting Res. Technol. 2015, Vol 47, 909919; Lighting Res. Technol. 2011; 43: 7-30; and Musco's *Melanopic Perceived Brightness* (*MPB*) paper (Schlesselman, B., et al., "Melanopsin richer photopically metameric lights experienced in a simulated sports field environment are perceived as relatively brighter," presented at 31st International Pupil Colloquium 2015, 13-17 Sep. 2015, Pembroke College, University of Oxford, Pembroke Square, Oxford OX1 1DW), but mapping the spectral power distributions onto the foregoing models revealed that such models do not accurately predict Applicant's experimental data.

In the first through fourth booth surveys, subjects observed significant average brightness increases for the High PB illuminated booth, with the perceived brightness increase being generally proportional to the ratio of cyan/amber phosphors. A brightness increase was also perceived for the light source used in the fifth booth survey, but such light source utilized a green phosphor instead of a cyan phosphor. Increases from 3.7% to 21% in perceived brightness were observed for High PB light sources in the first through fifth booth surveys.

FIG. 6A is a table including results of first through fifth booth surveys utilizing the side-by-side illuminated booths as described above to compare spectral outputs of the High PB light sources to the 70 CRI PoR light source. The first row of the table identifies, in the first through ninth columns, the following: the survey, the booth setup (e.g., unfilled versus filled), the spectra source, luminous flux (lm/W) and percentage change versus the PoR source, perceived brightness increase predicted by the MPB model, perceived brightness increase produced by the $V(I)_{10°}$ model, perceived brightness increase (percent) observed by the test subjects, calculated perceived brightness per watt (percent) relative to the 70 CRI PoR source, and Melanopic/Photopic (M/P) ratio calculated for emissions of the spectra source. The second row of the table corresponds to the 70 CRI PoR source, embodying a Cree® EasyWhite® (EZW) emitter (Cree, Inc., Durham, N.C.) including at least one blue LED configured to stimulate emissions from a YAG phosphor and a short nitride red phosphor. The third through seventh rows of the table correspond to the first, second, fourth, third, and fifth booth surveys, respectively. The light sources for the foregoing booth surveys have been described previously herein. The light source for the fourth booth survey is the same as for the second survey, but the fourth booth survey utilized a low lux test (down to 100 lx) to determine whether the perceived brightness increase would be maintained at different lux levels. As shown in the seventh column ("experimental results"), the perceived brightness gain is substantially maintained over a wide range of illuminance (e.g., 900 lx in the second booth survey, and as low as 100 lx in the fourth booth survey).

With continued reference to FIG. 6A, the sixth row provides results for the third booth survey. The light source for the third booth survey exhibited the greatest increase in perceived brightness (e.g., 21%, as shown in the seventh column), but also the lowest color rendering (i.e., a CRI value of 45, representing a level generally below a minimum standard for general illumination). This shows that increasing the cyan spectral content above a certain extent may have a detrimental impact on color quality, despite the beneficial increase in perceived brightness.

The seventh row of the table of FIG. 6A provides results for the fifth booth survey. The light source for the fifth booth survey exhibited the only increase of all sources in perceived brightness per watt relative to the PoR light source—notably, while also significantly enhancing color rendering, increasing to a CRI value of 90 relative to the CRI value of 70 for the PoR source. This is attributable in significant part to utilization of the well-optimized GNYAG (green) phosphor in the light source for the fifth booth survey, versus utilization of less-well-optimized cyan phosphors in the light sources for the first through fourth booth surveys. It is believed that further development and optimization of cyan phosphors will enable increased perceived brightness sources with greater perceived brightness per watt to be provided.

FIG. 6B is a table identifying results of a sixth booth survey utilizing the above-described side-by-side illuminated booths to compare a 78 CRI LED-based High PB light source (similar to the light source of the second and fourth booth surveys) to an 80 CRI PoR LED light source including at least one blue LED configured to stimulate emissions from a YAG phosphor and a short nitride red phosphor. The table of FIG. 6B includes the same columns as provided in the table of FIG. 6A. As shown, the High PB light source provided emissions having a perceived brightness 7.1% greater than that of the PoR light source with a similar color fidelity (i.e., a CRI values of 78 versus 80 for the PoR source), but exhibited a lower perceived brightness per watt.

Figure 7A:
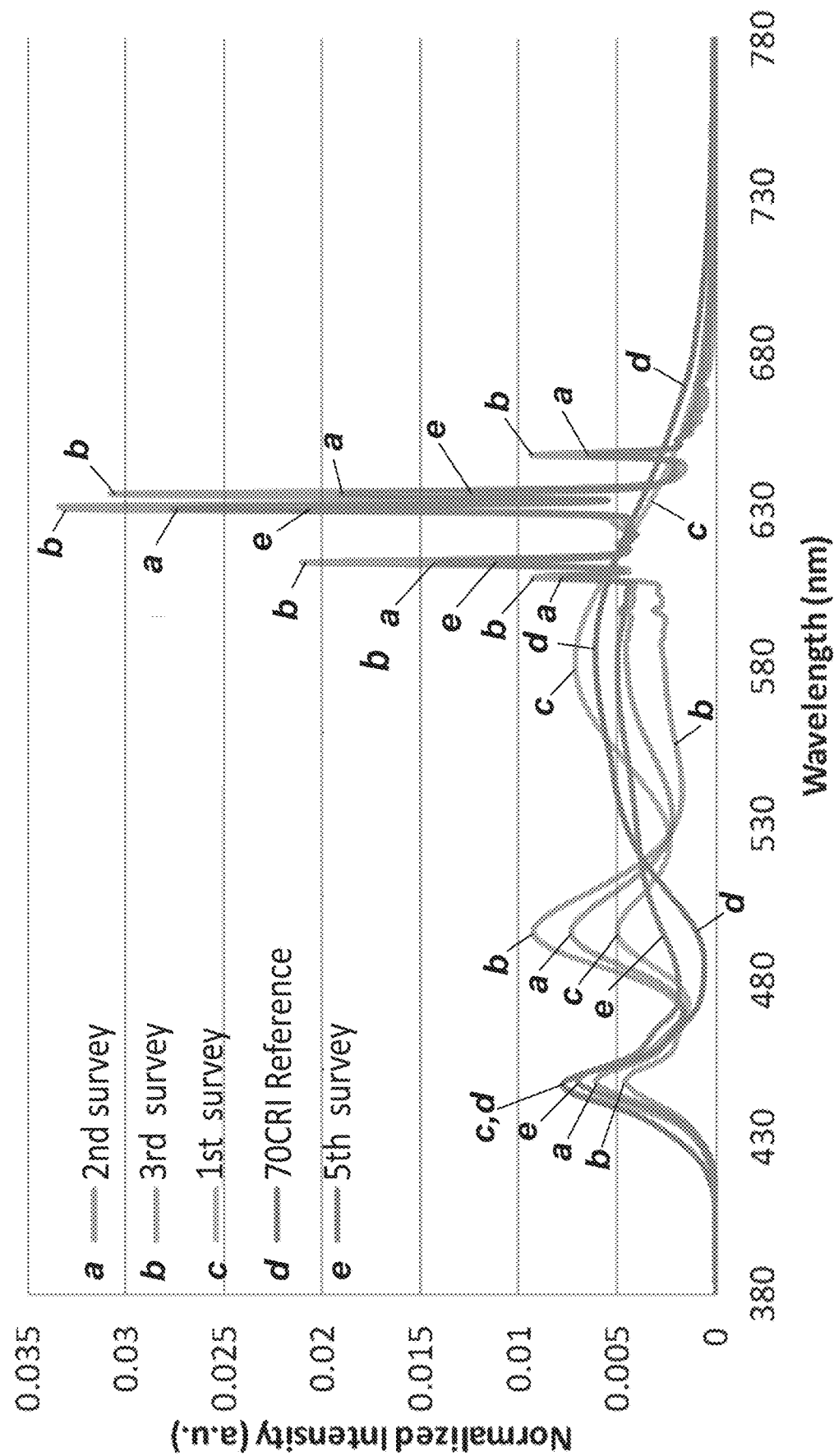
FIG. 7A provides spectral power distribution plots (in normalized intensity versus wavelength) for four light sources and the reference light source utilized in the first, second, third, and fifth surveys described in connection with FIG. 6A.

FIG. 7A provides spectral power distribution plots (in normalized intensity versus wavelength) for the light sources utilized in the booth surveys described in connection with FIG. 6A. As shown, the spectral power distribution for the PoR source (i.e., PoR EZW 4000K 70 CRI, labeled "d") in a cyan range is the least of all depicted light sources. Also, the light source for the third booth survey (labeled "b") exhibits the most prominent peaks for cyan, amber, and red content, while exhibiting the least spectral energy content between roughly 530-590 nm, thereby explaining the low CRI value of 45 shown in the table of FIG. 6A for this light source.

Figure 7B:
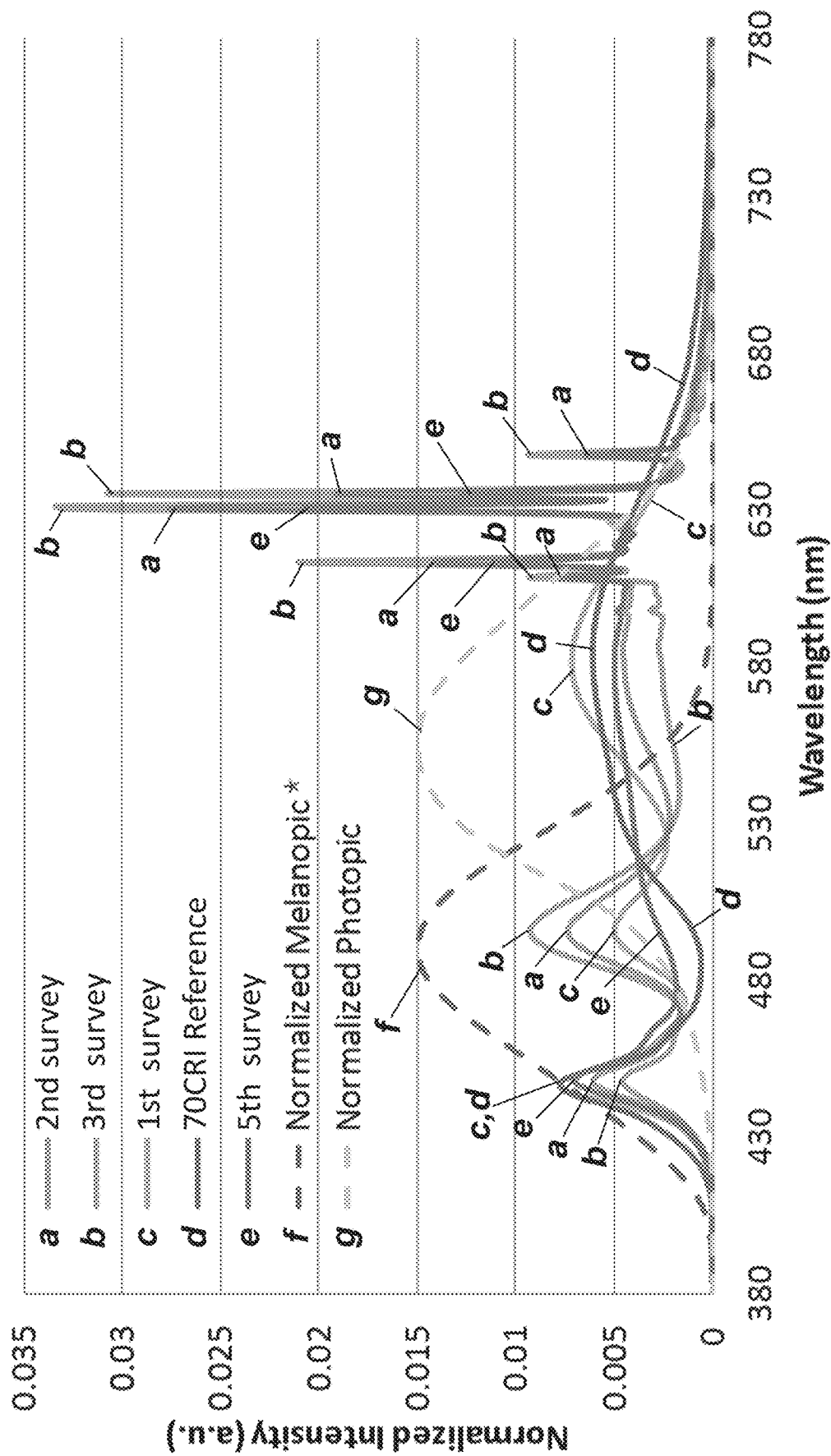
FIG. 7B provides the same image as FIG. 7A, with addition of normalized melanopic and normalized photopic spectral power distribution plots.

FIG. 7B provides the same image as FIG. 7A, with addition of normalized melanopic and normalized photopic spectral power distribution (SPD) plots. As shown, the normalized melanopic response curve plot has a peak near 490 nm (thereby encompassing the cyan peaks for various light sources), and the normalized photopic SPD plot has a peak near about 565 nm (thereby encompassing the amber peaks for various light sources). The normalized melanopic and photopic response curves also overlap significantly with one another.

A Melanopic/Photopic ratio ("M/P ratio") may be defined for a particular light source by dividing an integrated spectral output of the light source coincident with the melanopic response curve by an integrated spectral output of the light source coincident with the photopic response curve, according to the following equation:

$$M/P \text{ ratio} = \frac{\int_{380}^{780} M(\lambda) \cdot I(\lambda) d\lambda}{\int_{380}^{780} V(\lambda) \cdot I(\lambda) d\lambda}$$

Figure 8:
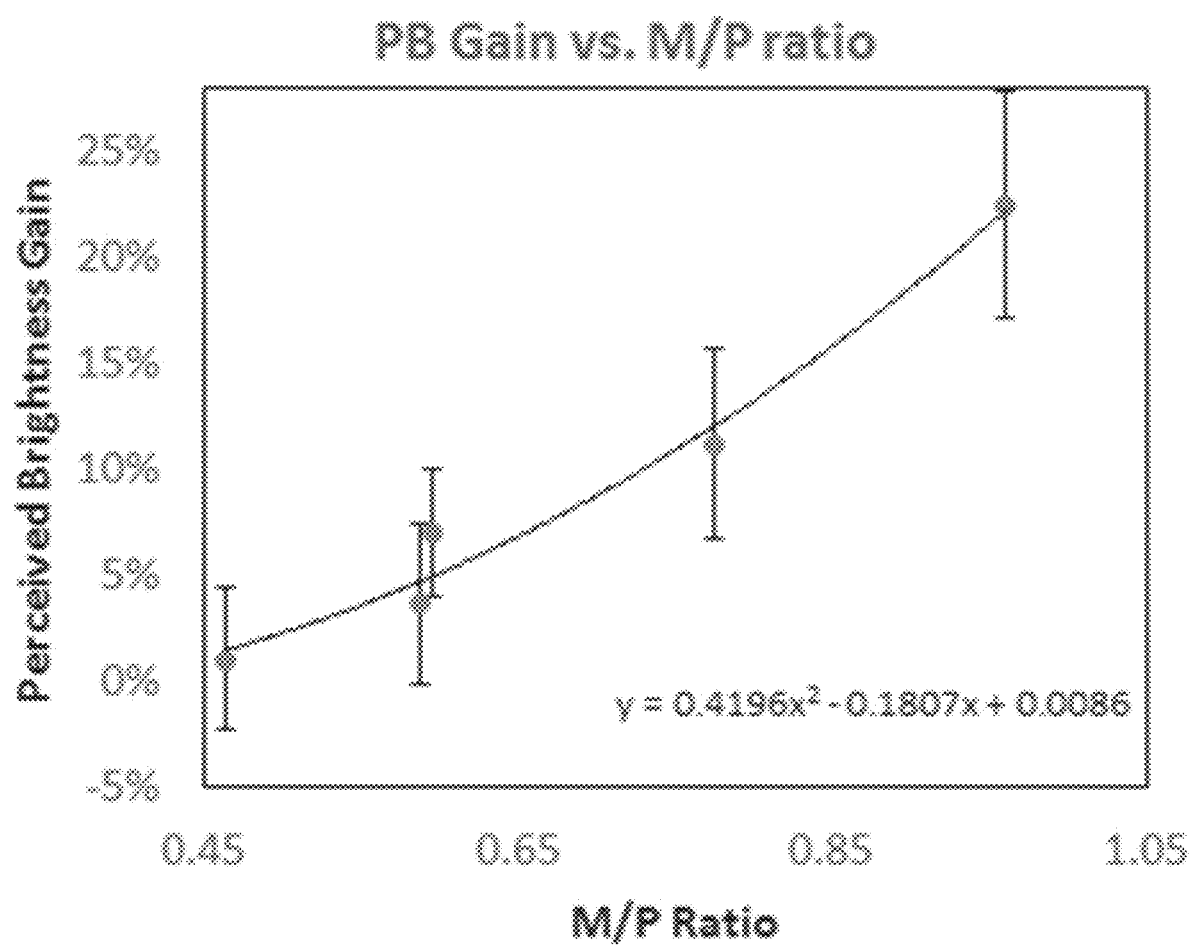
FIG. 8 is a plot of perceived brightness gain versus melanopic/photopic spectral ratio for the light sources utilized in the first through fifth booth surveys described in connection with FIG. 6A.

FIG. 8 is a plot of perceived brightness gain versus melanopic/photopic spectral ratio (M/P ratio) for the light sources utilized in the first through fifth booth surveys described in connection with FIG. 6A. In addition, data is plotted for comparison of POR 70 CRI on both sides (M/P ratio of approximately 0.46) showing no perceived brightness gain, as expected. As shown, perceived brightness gain appears to be directly proportional to M/P ratio, with a polynomial curvefit value being provided for the data points corresponding to the four light sources. As noted previously, however, it is not trivial to enhance perceived brightness while at the same time also maintain color rendering values at or above a minimum value (e.g., CRI Ra value of at least 70, 75, 80, 85, or another threshold specified herein) sufficient for general illumination.

Figure 9:
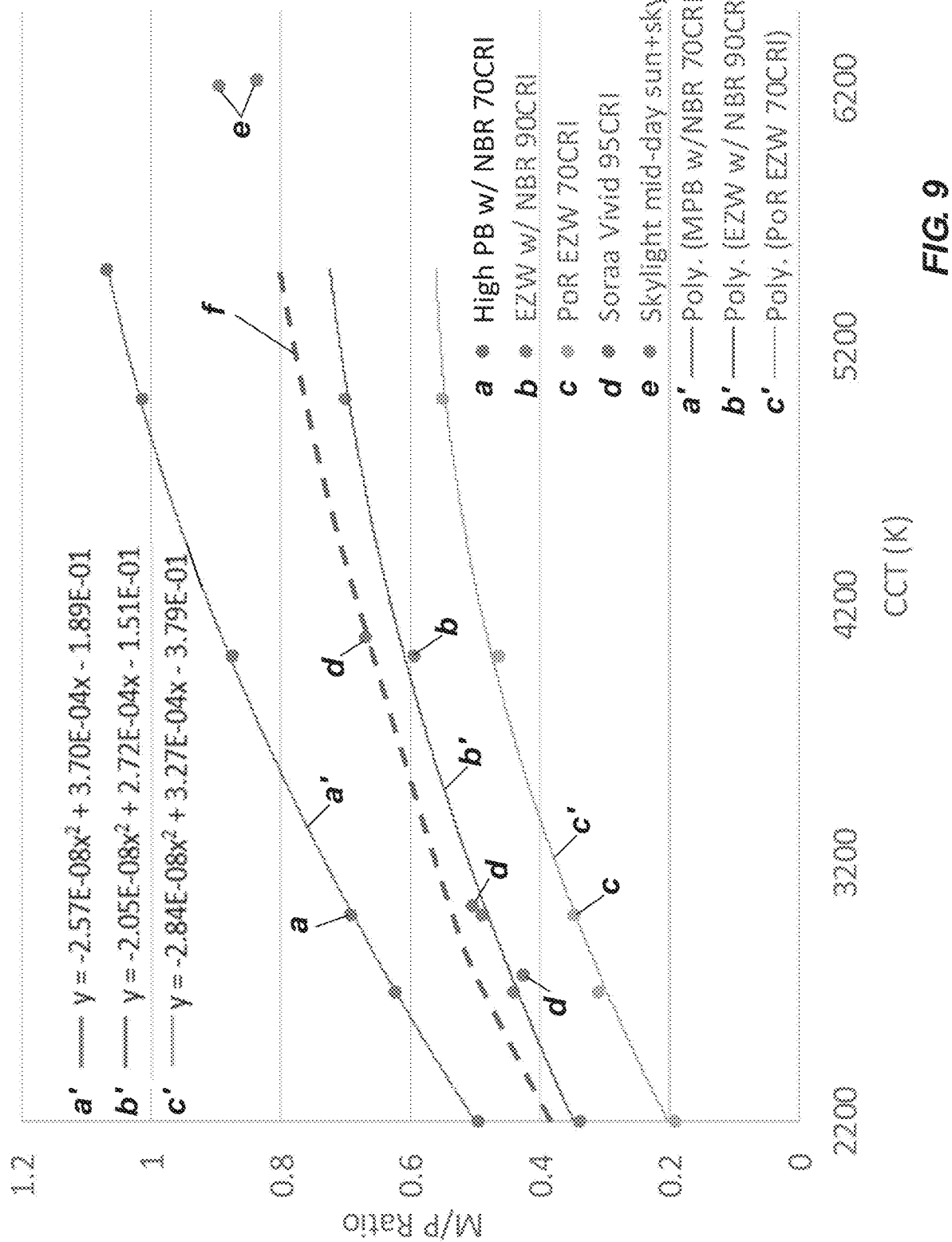
FIG. 9 provides plots and superimposed curvefits of melanopic/photopic spectral ratio versus CCT for the first PoR 70 CRI light source, for the light source used in the fifth booth survey, and for a modeled High PB light source having at least 70 CRI, with addition of data points for a commercially available Soraa Vivid 95 CRI light source and for an artificial skylight with a mid-day sun and sky setting.

FIG. 9 provides plots and superimposed curvefits of melanopic/photopic spectral ratio versus CCT for the first PoR 70 CRI light source, for the High PB light source used in the fifth booth survey, and for a modeled High PB light source having at least 70 CRI—with addition of data points for a commercially available Soraa Vivid 95 CRI light source and for an artificial skylight with a mid-day sun and sky setting for the purpose of comparison. Each illustrated curve slopes upward to the right, indicating that M/P ratio generally increases with CCT for the illustrated range (e.g., 2200K to about 5400K). The lowermost curve (c') corresponds to a conventional light source. The next curve (b') upward from the lowermost curve corresponds to the High PB light source used in the fifth booth survey (including a blue LED arranged to stimulate each of a green YAG (GNYAG) phosphor with a peak wavelength of about 526 nm, a short nitride red phosphor with a peak of about 610 nm and FWHM of about 76 nm, and a narrowband red KSF phosphor) providing aggregated emissions with increased perceived brightness and a CRI Ra value of 90. An offset curve (f) (illustrated in dashed lines) embodies a percentage offset upward from the preceding curve (b'). In certain embodiments, the percentage offset may be 5%, 10%, 15%, 20%, 25%, 30%, 35%, 40%, or 50% (corresponding to offset multiplier coefficients 1.05, 1.10, 1.15, 1.20, 1.25, 1.30, 1.35, 1.40, and 1.50) relative to the curve (b') corresponding to the High PB light source used in the fifth booth survey. The uppermost curve (a') in FIG. 9 corresponds to a modeled High PB light source having at least 70 CRI, with such light source embodying a solid state light emitter arranged to generate emissions having a peak wavelength in a blue range, and configured to stimulate emissions of first through third lumiphoric materials having peak wavelengths in ranges of from 485 nm to 530 nm, from 575 nm to 595 nm, and from 605 nm to 640 nm, respectively, wherein the third peak wavelength corresponds to a third peak having a full width half maximum value of less than 60 nm. Curvefit functions for the curves shown in solid lines (curves c', b' and a') are also provided in FIG. 9.

An area between the curves b' and a' corresponds to blue solid state emitter-pumped multi-phosphor light sources configured to provide high perceived brightness in combination with suitably high color rendering values, and that differentiate light sources known in the art (e.g., a PoR 70 CRI light source represented by curve c'). The Soraa Vivid 95 CRI light source corresponding to data points d in FIG. 9 may provide similar M/P ratio values, but includes phosphors pumped with a violet (405 nm peak) LED (i.e., not a blue LED), and may exhibit lower efficiency (e.g., luminous efficacy). To encompass a first desired area between the curves b' and a' of FIG. 9, in one embodiment of the present disclosure, aggregated emissions of a lighting device may have a spectral power distribution with a M/P ratio value within a target range as a function of CCT (in Kelvin) of the aggregated emissions, the target range including minimum values defined by a minimum value function in which M/P ratio equals [$-2.05 \times 10^{-8}(CCT)^2 + 2.72 \times 10^{-4}(CCT) - 0.1506$], and the target range including maximum values defined by a maximum value function in which M/P ratio equals [$-2.57 \times 10^{-8}(CCT)^2 + 3.70 \times 10^{-4}(CCT) - 0.1889$]. In certain embodiments, CCT may be in a range of from 2000 to 7000K, or from 2000 to 6000K, or from 2000 to 5500K, or from 2200 to 5500K. In certain embodiments, to encompass a second desired area between the curves f and a' of FIG. 9, aggregated emissions of a lighting device may have a spectral power distribution with a M/P ratio value within a target subrange as a function of CCT (in Kelvin) of the aggregated emissions, the target subrange including minimum values defined by a minimum value function in which M/P ratio equals [(offset multiplier coefficient)$\times$([$-2.05 \times 10^{-8}(CCT)^2 + 2.72 \times 10^{-4}(CCT) - 0.1506$]), the target range including maximum values defined by a maximum value function in which M/P ratio equals [$-2.57 \times 10^{-8}(CCT)^2 + 3.70 \times 10^{-4}(CCT) - 0.1889$]. As noted previously, the offset multiplier coefficient in certain embodiments may have a value of 1.05, 1.10, 1.15, 1.20, 1.25, 1.30, 1.35, 1.40, or 1.50.

Figure 10A:
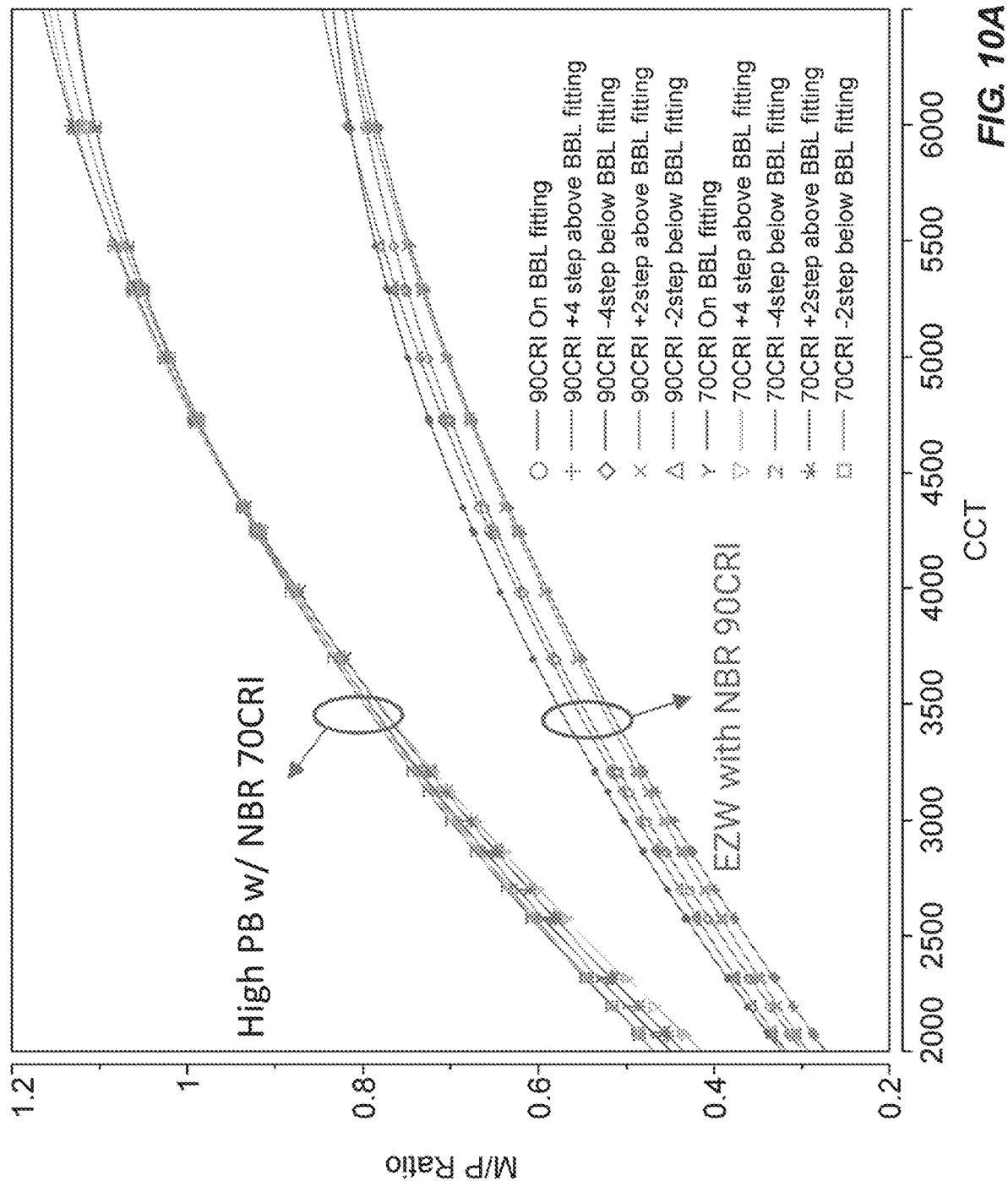
FIG. 10A provides plots and superimposed curvefits of melanopic/photopic spectral ratio versus CCT for two light sources at five different positions relative to the blackbody locus (BBL), namely: on the BBL, within a MacAdam 4 step ellipse above the BBL, within a MacAdam 4 step ellipse below the BBL, within a MacAdam 2 step ellipse above the BBL, and within a MacAdam 2 step ellipse below the BBL.
Figure 10B:
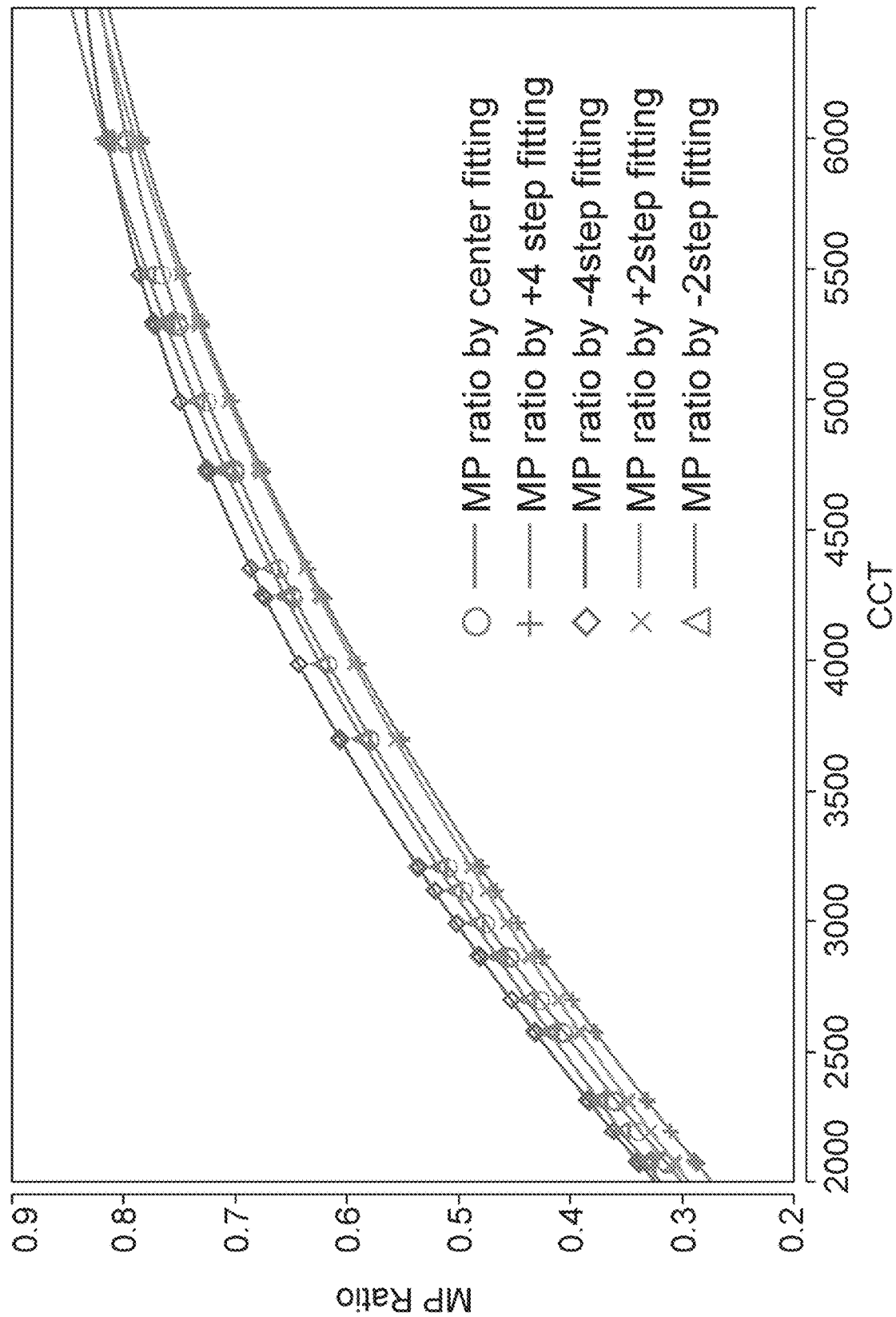
FIG. 10B provides a magnified view of a lower portion of FIG. 10A.
Figure 10C:
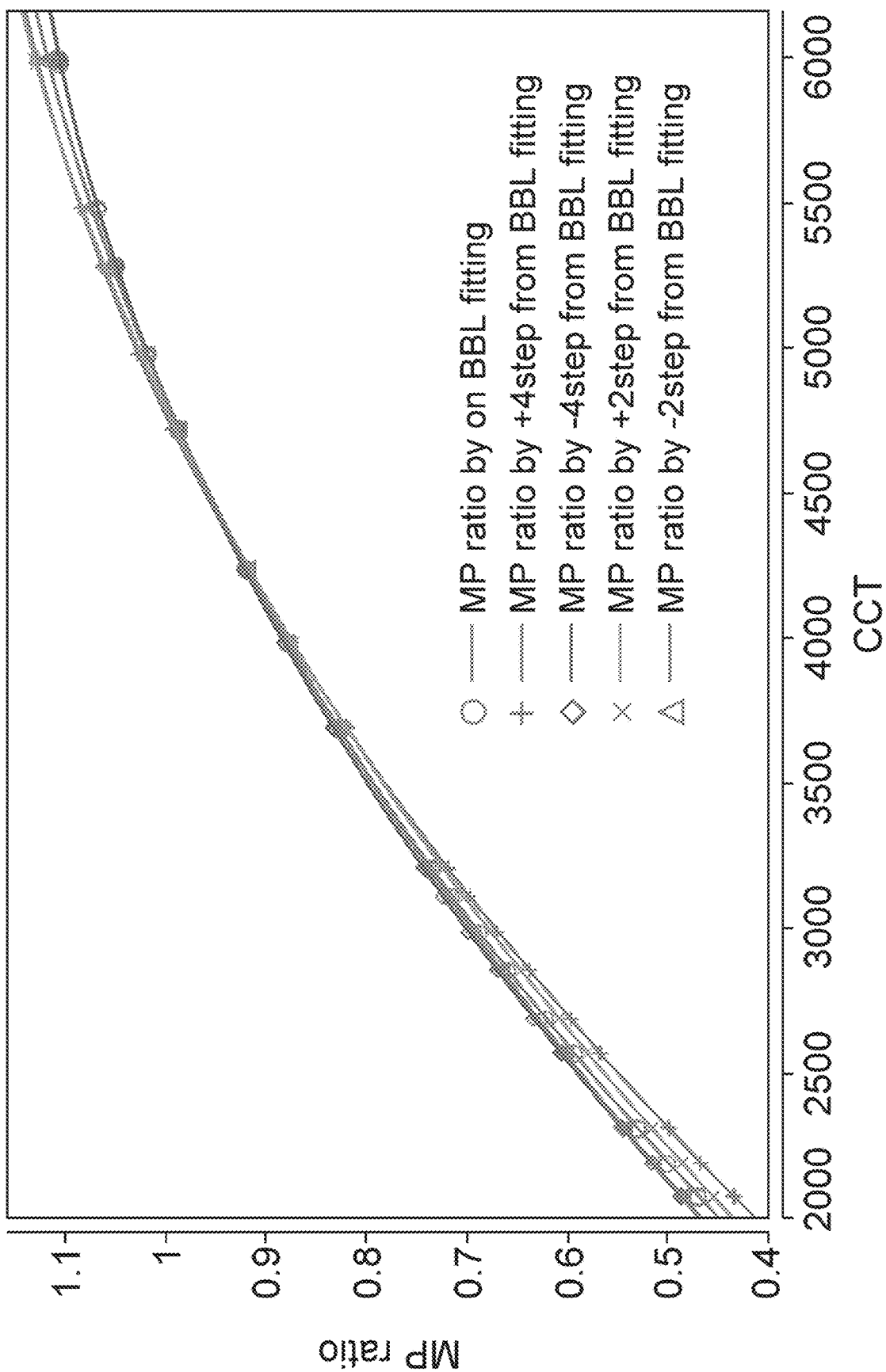
FIG. 10C provides a magnified view of an upper portion of FIG. 10A.

The preceding discussion of enhanced perceived brightness light sources providing suitably high color rendering index values addressed color points on the blackbody locus. To consider whether enhanced perceived brightness in combination with suitably high color rendering index values may be obtained for light sources producing color points off the blackbody locus (BBL), computer modeling was performed for light sources corresponding the High PB light source used in the fifth booth survey (described as "EZW with NBR 90CRI" in FIG. 10A), and for a High PB light source having at least 70 CRI (as mentioned in connection with FIG. 9, and described as "High PB with NBR 70CRI" in FIG. 10A) for color points on, above (e.g., MacAdam 2-step and 4-step ellipses above), and below (e.g., MacAdam 2-step and 4-step ellipses below) the BBL. Results of such modeling are shown in FIGS. 10A-10C. The lower set of curves in FIG. 10A (and shown in FIG. 10B) correspond to the "EZW with NBR 90CRI" light source, with such terms signifying "EasyWhite with narrowband red, 90 CRI." Such light source included a 450 nm peak wavelength blue LED arranged to stimulate emissions of a GNYAG green phosphor, a short nitride red phosphor, and a narrowband red KSF phosphor. In FIG. 10B, for the whole CCT range, at the same CCT, the above-BBL color points exhibited a lower M/P ratio than the below-BBL color points, and color points farther away from the BBL exhibited larger M/P ratio differences. The upper set of curves in FIG. 10A (and shown in FIG. 10C) correspond to the "High PB with NBR 70CRI" light source, with such terms signifying "increased perceived brightness with narrowband red, 70 CRI." Such light source included a 450 nm peak wavelength blue LED arranged to stimulate emissions of a cyan phosphor, an amber phosphor, and a narrowband red KSF phosphor. In FIG. 10C, for CCT values below 4000K, at the same CCT, the above-BBL color points exhibited lower M/P ratios than the below-BBL color points. For CCT values above 4000K, the foregoing trend was not maintained. As shown in FIGS. 10A-10C, desired combinations of enhanced perceived brightness and suitably high color rendering index values may be obtained not only for color points on the BBL, but also to color points proximate to the BBL. Based on extrapolation of the data reflected in FIG. 10A, the desired combination of features is believed to be attainable for color points within a MacAdam±10 step ellipse of the BBL.

Figure 11:
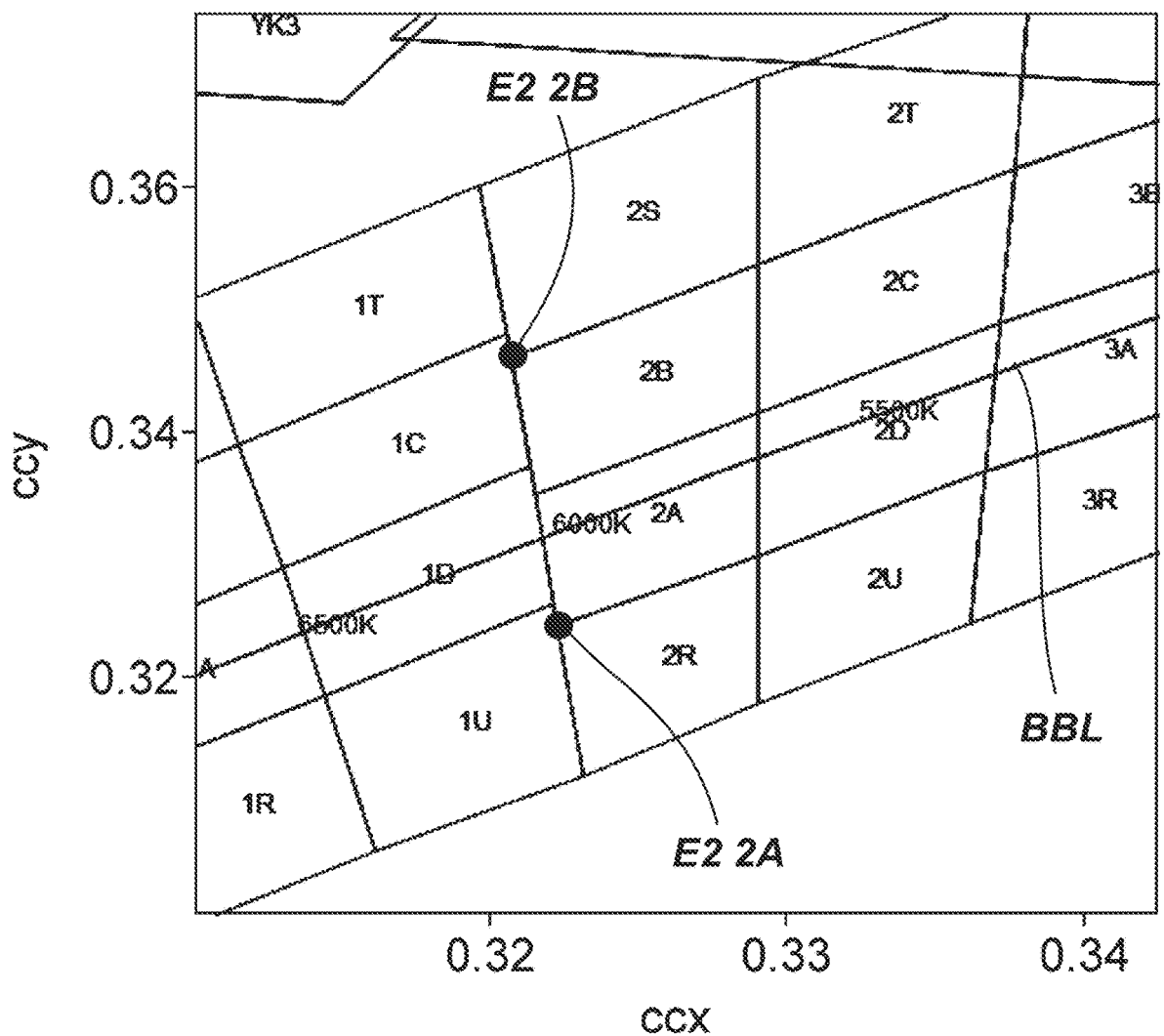
FIG. 11 shows color points for two light sources E2 2A and E2 2B arranged below and above the BBL, respectively, at a CCT value of just above 6000K, in a magnified portion of a 1931 CIE chromaticity diagram.

FIG. 11 shows color points for first and second light sources "E2 2A" and "E2 2B" arranged below and above the BBL, respectively, at a CCT value of just above 6000K, in a magnified portion of a 1931 CIE chromaticity diagram, and corresponding to modeling results discussed in connection with FIGS. 10A-10C. Each of the first and second color points E2 2A, E2 2B is offset from the BBL by a duv value of 0.004, corresponding to a MacAdam 4-step ellipse.

Figures 12, 13:
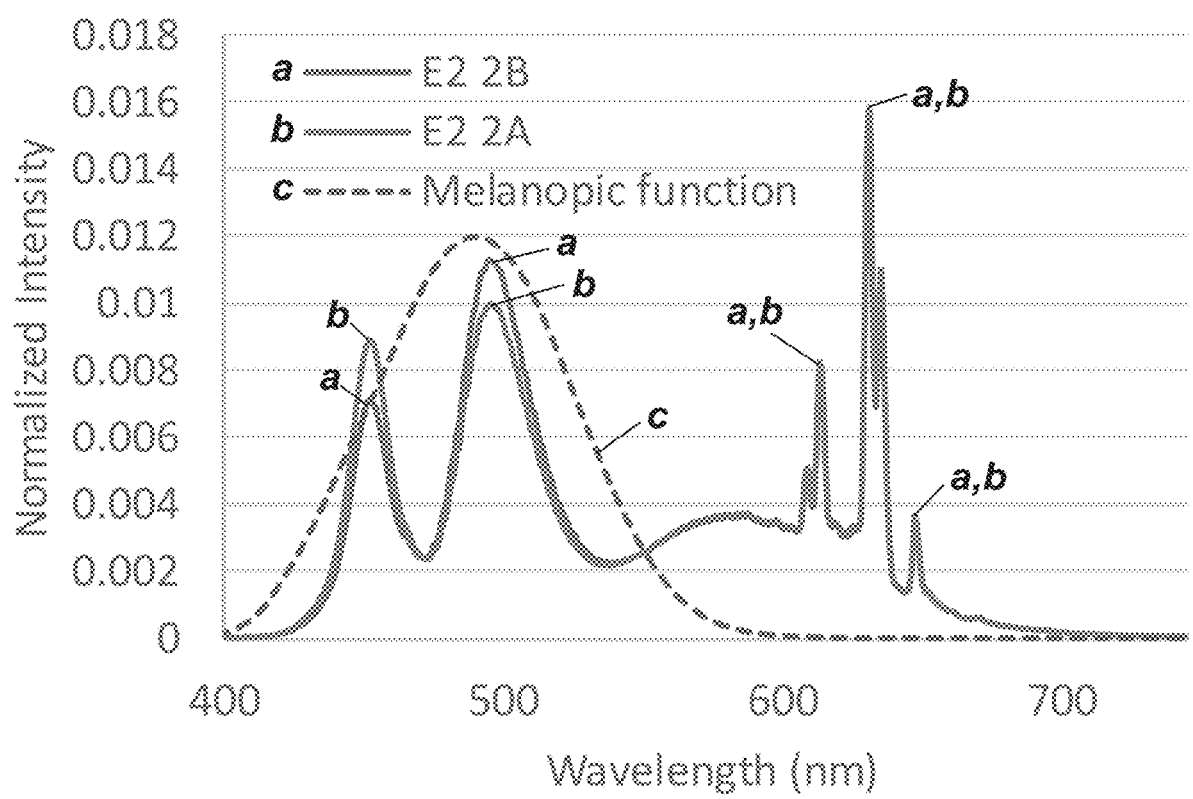
FIG. 12 provides spectral power distribution plots (in normalized intensity versus wavelength) for the two light sources (namely, E2 2A and E2 2B) of FIG. 11, with a superimposed normalized melanopic spectral power function plot.
FIG. 13 is a table identifying duv, CCT, CRI, and M/P ratio values for two light sources E2 2A and E2 2B of FIGS. 11 and 12.

FIG. 12 provides spectral power distribution plots (in normalized intensity versus wavelength) for the two light sources (namely, E2 2A and E2 2B) of FIG. 11, with a superimposed normalized melanopic spectral power function plot. FIG. 13 is a table identifying duv, CCT, CRI, and M/P ratio values for two light sources E2 2A and E2 2B of FIGS. 11 and 12. In general, at the same CCT, above-BBL spectral power distributions have lower M/P ratio than below-BBL spectral power distributions for the same emitter plus phosphor blend, since below-BBL spectral power distributions have a higher "blue peak," and thus a higher M/P ratio. An exception to this general rule is encountered when the "cyan peak" is very close to the "blue peak (such as in the E2 bin shown in FIG. 11). Referring to FIG. 13, the "E2 2B" spectral power distribution exhibited a higher M/P ratio than the "E2 2A" spectral power distribution at the same CCT.

As noted previously, in certain embodiments, one of the spectral peaks mentioned above may be provided by a supplemental (e.g., cyan, green, amber/orange, or red) electrically activated solid state light emitter (e.g., an LED) instead of a lumiphoric material. In certain embodiments, all electrically activated solid state light emitters may be covered with a single lens, diffuser, and/or optical element. In certain embodiments, a supplemental electrically activated solid state light emitter is configured to provide narrowband red output (e.g., in a range of from 605 nm to 640 nm, or in a subrange of from 610 nm to 635 nm, or in a subrange of from 610 nm to 625 nm). In certain embodiments, a supplemental electrically activated solid state light emitter is configured to provide cyan or cyan/green output (e.g., in a range of from 485 nm to 530 nm, or in a subrange of from 485 nm to 505 nm, or in a subrange of from 490 nm to 500 nm). In certain embodiments, any supplemental electrically activated solid state light emitters are controlled in tandem with (i.e., not independently from) the (e.g., blue-emitting) electrically activated solid state light emitter(s). In certain embodiments, any supplemental electrically activated solid state light emitters may be independently controlled relative the (e.g., blue-emitting) electrically activated solid state light emitter(s).

Having described desirable combinations of solid state emitters and lumiphoric materials, solid state lighting devices that may incorporate such emitters and lumiphoric materials will now be described.

In certain embodiments, one or more solid state emitters and lumiphoric materials may be provided in a single-chip or multi-chip LED package.

Figure 14:
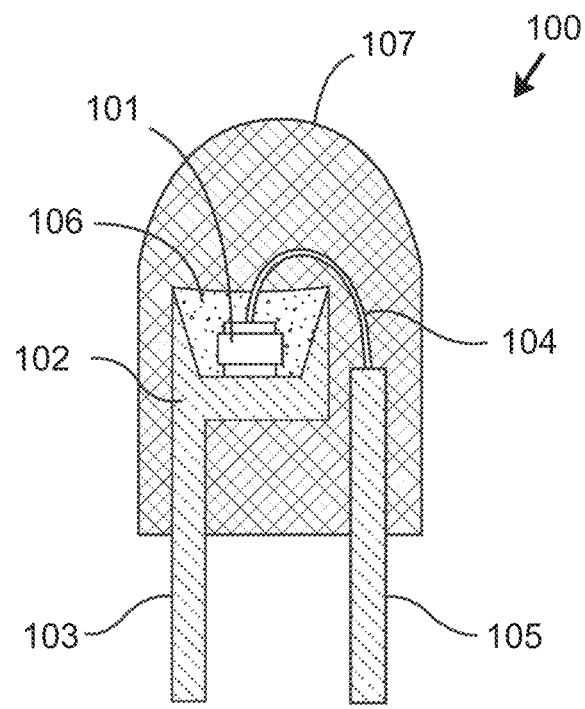
FIG. 14 is a schematic cross-sectional view of a first exemplary light emitting diode that may embody (or may be incorporated in) a lighting device according to one embodiment of the present disclosure.

FIG. 14 illustrates a LED package 100 a single LED chip 101 mounted on a reflective cup 102 using solder or a conductive epoxy, such that ohmic contacts for the cathode (or anode) of the LED chip 101 are electrically coupled to the bottom of the reflective cup 102. The reflective cup 102 is either coupled to or integrally formed with a first lead 103 of the LED package 100. One or more bond wires 104 connect ohmic contacts for the anode (or cathode) of the LED chip 101 to a second lead 105. The reflective cup 102 may be filled with an encapsulant material 106 that encapsulates the LED chip 101. The encapsulant material 106 may be clear or contain one or more wavelength conversion materials, such as phosphors or other lumiphoric materials. The entire assembly is encapsulated in a clear protective resin 107, which may be molded in the shape of a lens to control the light emitted from the LED chip 101 and any lumiphoric material(s) contained in the reflective cup 102.

Figure 15:
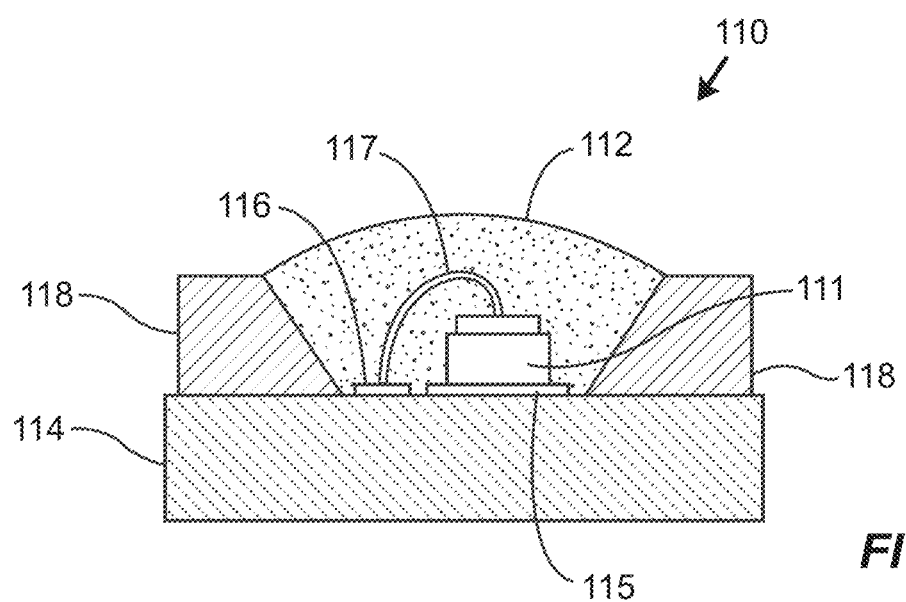
FIG. 15 is a schematic cross-sectional view of a second exemplary light emitting diode that may embody (or may be incorporated in) a lighting device according to one embodiment of the present disclosure.

An alternative LED package 110 is illustrated in FIG. 15 wherein a LED chip 111 is mounted on a substrate 114. Ohmic contacts for the anode (or cathode) of the LED chip 111 are directly mounted to first contact pads 115 on the surface of the substrate 114. The ohmic contacts for the cathode (or anode) of the LED chip 111 are connected to second contact pads 116, which are also on the surface of the substrate 114, using bond wires 117. The LED chip 111 resides in a cavity of a reflector structure 118, which is formed from a reflective material and functions to reflect light emitted from the LED chip 111 through the opening formed by the reflector structure 118. The cavity formed by the reflector structure 118 may be filled with an encapsulant material 112 that encapsulates the LED chip 111. The encapsulant material 112 may be clear or contain at least one wavelength conversion material, such as one or more phosphors or other lumiphoric materials.

FIGS. 16A-19B illustrate exemplary portions of solid state lighting devices in different configurations incorporating electrically activated solid state light emitters arranged over package mounts (or other substrates) and optionally overlaid with lenses, wherein such devices may be used alone or in groups according to certain embodiments described herein. It is to be appreciated that various structures employed within complete lighting devices (e.g., package leads, leadframes, contacts, wirebonds, bond structures, heat transfer elements, diffusers, additional reflecting surfaces, power supplies, and the like) have been omitted for clarity of illustration, but one skilled in the art would appreciate that known structures could be incorporated in operative lighting devices including the illustrative portions provided in FIGS. 16A-19B.

Figure 16A:
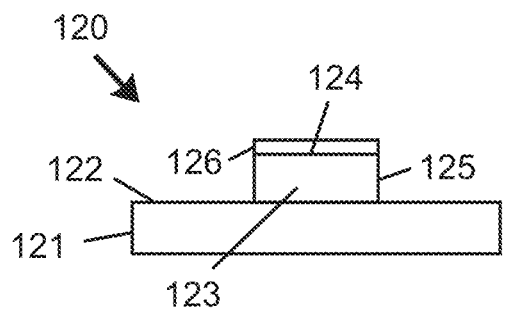
FIG. 16A is a side cross-sectional schematic view of at least a portion of a solid state light emitting device including a solid state emitter chip arranged over a package mount, with a top surface of the emitter chip being covered with a wavelength conversion material.

FIG. 16A illustrates a solid state light emitting device 120 including at least one solid state emitter (e.g., LED) chip 123 (which may include LED epitaxial layers and a support) arranged over a top surface 122 of a package mount (or other substrate) 121, with a top surface 124 of the solid state emitter chip 123 being covered with at least one lumiphoric material 126 (e.g., a mixture or dispersion of different lumiphoric materials as disclosed herein). The package mount 121 may include metalized regions and/or vias (not shown) for conduction of electrical signals to the solid state emitter chip 123. Side surfaces 125 of the solid state emitter chip 123 may be exposed, or in certain embodiments may be coated with one or more materials or encapsulant.

Figure 16B:
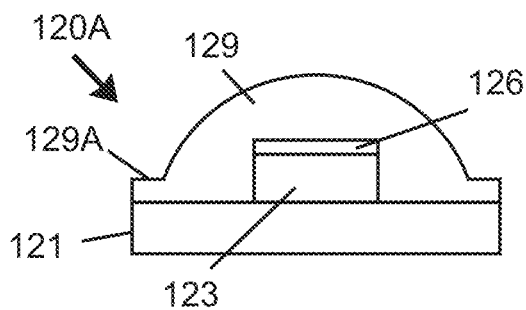
FIG. 16B is a side cross-sectional schematic view of at least a portion of a solid state light emitting device including the device of FIG. 16A with addition of a curved (e.g., hemispherical) lens.

FIG. 16B illustrates a solid state light emitting device 120A including the device 120 of FIG. 16A following addition of a lens 129 having a curved (e.g., substantially hemispherical) shape. Such lens 129 may be formed by any suitable method, including but not limited to molding using silicone material. In certain embodiments, the lens 129 may have a width or lateral extent that is substantially equal to a width or lateral extent of the package mount 121, and a peripheral portion 129A of the lens 129 may have a substantially uniform thickness.

Figure 17A:
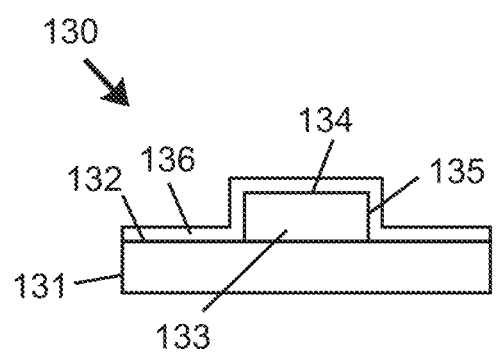
FIG. 17A is a side cross-sectional schematic view of at least a portion of a solid state light emitting device including a solid state emitter chip arranged over a package mount, with top and side surfaces of the emitter chip and an upper surface of the package mount being covered with a wavelength conversion material.

FIG. 17A illustrates a solid state light emitting device 130 including a solid state emitter (e.g., LED) chip 133 (which may include LED epitaxial layers and a support) arranged over an upper surface 132 of a package mount (or other substrate) 131, with a top surface 134 and side surfaces 135 of the solid state emitter chip 133, as well the upper surface 132 of the package mount 131, being covered with wavelength conversion (e.g., lumiphoric) material 136. In certain embodiments, the LED chip 133 may be mounted to the package mount 131, and thereafter the LED chip 133 and upper surface 132 of the package mount 131 may be coated with lumiphoric material 136. Coating may be performed according to any suitable process disclosed herein, such as spray coating, dipping, or the like. Such materials 136, 138 may be arranged in conformal layers that follow the shape and outline of multiple surfaces of the solid state emitter chip 133. Electrical connections to the LED chip 133 may be made either before or after coating steps.

Figure 17B:
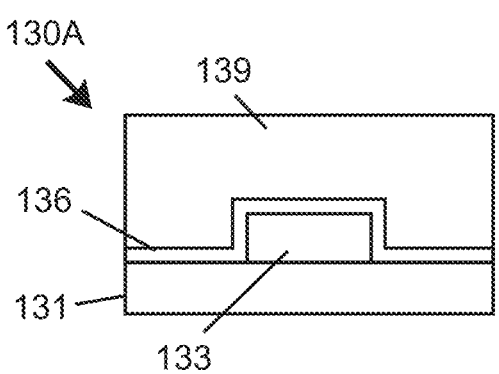
FIG. 17B is a side cross-sectional schematic view of at least a portion of a solid state light emitting device including the device of FIG. 17A with addition of a lens having a substantially rectangular cross-sectional shape.

FIG. 17B illustrates a solid state light emitting device 130A including the device 130 of FIG. 17A following addition of a lens 139 having a substantially rectangular cross-sectional curved (e.g., substantially hemispherical) shape. Such lens 139 may be formed by any suitable method, including but not limited to molding using silicone material. In certain embodiments, the lens 139 may have a width or lateral extent that is substantially equal to a width or lateral extent of the package mount 131.

Figure 18A:
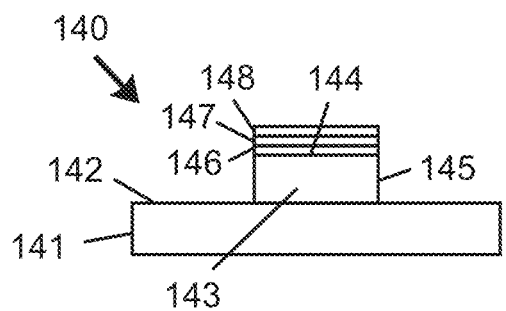
FIG. 18A is a side cross-sectional schematic view of at least a portion of a solid state light emitting device including a solid state emitter chip arranged over a package mount, with a top surface of the emitter chip being covered with at least one wavelength conversion material layers.

FIG. 18A illustrates a solid state light emitting device 140 including a solid state emitter (e.g., LED) chip 143 (which may include LED epitaxial layers and a support) arranged over a upper surface 142 of a package mount (or other substrate) 141, with a top surface 144 of the solid state emitter chip 143 being covered with first through third layers 146, 147, 148 of lumiphoric materials. The package mount 141 may include metalized regions and/or vias (not shown) for conduction of electrical signals to the solid state emitter chip 143. Side surfaces 145 of the solid state emitter chip 143 may be exposed or otherwise coated lumiphoric material. In certain embodiments, the LED chip 143 may be coated with lumiphoric materials 146-148, and thereafter the pre-coated LED chip 143 may be mounted to the package mount 141 followed by establishment of suitable electrically conductive connection(s) to the LED chip 143. Coating may be performed according to any suitable process disclosed herein, such as spray coating.

Figure 18B:
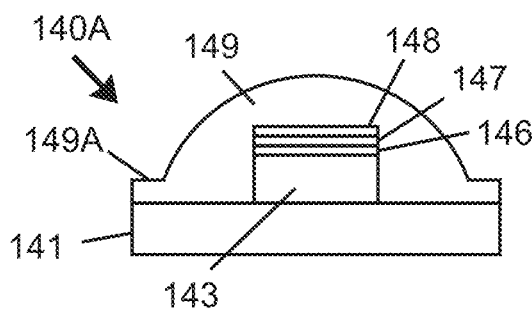
FIG. 18B is a side cross-sectional schematic view of at least a portion of a solid state light emitting device including the device of FIG. 18A with addition of a curved (e.g., hemispherical) lens.

FIG. 18B illustrates a solid state light emitting device 140A including the device 140 of FIG. 18A following addition of a lens 149 having a curved (e.g., substantially hemispherical) shape. Such lens 149 may be formed by any suitable method, including but not limited to molding using silicone material. In certain embodiments, the lens 149 may have a width or lateral extent that is substantially equal to a width or lateral extent of the package mount 141, and a peripheral portion 149A of the lens 149 may have a substantially uniform thickness.

Figure 19A:
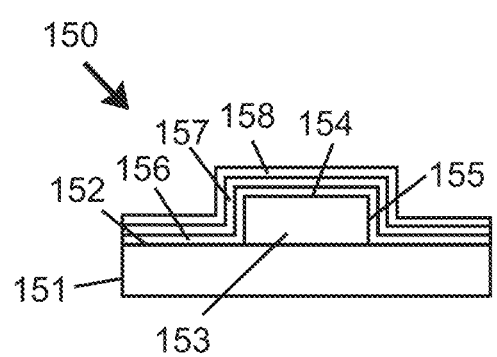
FIG. 19A is a side cross-sectional schematic view of at least a portion of a solid state light emitting device including a solid state emitter chip arranged over a package mount, with top and side surfaces of the emitter chip and an upper surface of the package mount being covered with multiple wavelength conversion material layers.

FIG. 19A illustrates a solid state light emitting device 150 including a solid state emitter (e.g., LED) chip 153 (which may include LED epitaxial layers and a support) arranged over an upper surface 152 of a package mount (or other substrate) 151, with a top surface 154 and side surfaces 155 of the solid state emitter chip 153, as well as an upper surface 152 of the package mount 151, being covered with first through third layers of lumiphoric material 156, 157, 158. In certain embodiments, the LED chip 153 may be mounted to the package mount 151, and thereafter the LED chip 153 and upper surface 152 of the package mount 151 may be coated with the lumiphoric material layers 156-158. Coating may be performed according to any suitable process disclosed herein, such as spray coating. The lumiphoric material layers 156-158 may be arranged in conformal layers that follow the shape and outline of multiple surfaces of the solid state emitter chip 153. Electrical connections to the LED chip 155 may be made either before or after coating steps.

Figure 19B:
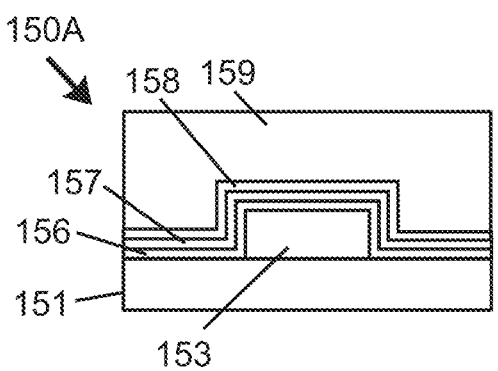
FIG. 19B is a side cross-sectional schematic view of at least a portion of a solid state light emitting device including the device of FIG. 19A with addition of a lens having a substantially rectangular cross-sectional shape.

FIG. 19B illustrates a solid state light emitting device 150A including the device 150 of FIG. 19A following addition of a lens 159 having a substantially rectangular cross-sectional curved (e.g., substantially hemispherical) shape. Such lens 159 may be formed by any suitable method, including but not limited to molding using silicone material. In certain embodiments, the lens 159 may have a width or lateral extent that is substantially equal to a width or lateral extent of the package mount 151.

Although specific lens shapes are illustrated in FIGS. 16B, 17B, 18B, 19B, it is to be appreciated that lenses according to any suitable shapes may be applied to any of the lighting devices illustrated in FIGS. 16A-19B. For example, symmetric, non-symmetric, polygonal, truncated hemispherical, faceted, textured, and/or trench-defining lenses may be used.

Figure 20:
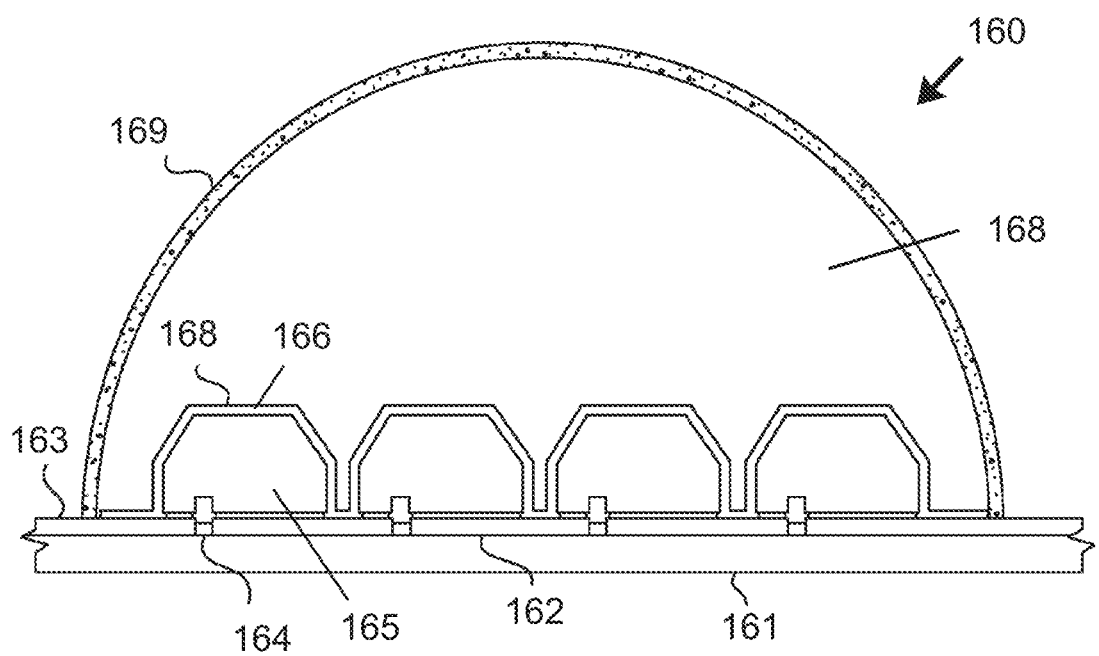
FIG. 20 is a side cross-sectional view of at least a portion of a solid state light emitting device including multiple solid state emitter chips coated with multiple lumiphoric materials and arranged under a hemispherical optical element.

FIG. 20 is a side cross-sectional view of at least a portion of a solid state light emitting device 160 including multiple solid state emitter (e.g., LED) chips 165 arranged over a submount 161 in flip-chip configuration, with both anode and cathode connections on the bottom of the chips 165. The solid state emitter chips 165 may (optionally) include angled or beveled upper edges with a non-rectangular (e.g., polygonal) cross-section, with such shape serving to enhance light extraction. The solid state emitter chips 165 are coated or otherwise covered with one or more lumiphoric materials 166 (e.g., in one or more conformal layers) and arranged under a hemispherical optical element (e.g., lens) 169, with the conformal layer(s) 166 following the shape and contour of multiple surfaces of the solid state emitter chips 165 (preferably with substantially constant thickness). Such coating may be performed using any coating technique disclosed herein or otherwise known in the art. As shown in FIG. 20, the conformal layer(s) 166 may extend over, between and laterally beyond the solid state emitter chips 165 (such as over a reflective material disposed between or adjacent to the solid state emitter chips 165). The optical element 169 may be separated from the solid state emitter chips 165 via a gap or an intervening material 168, which may include encapsulant or a fluid medium such as liquid or gel (e.g., mineral oil, perfluorinated polyether (PFPE) liquid, or other fluorinated or halogenated liquid or gel). Such intervening material 168 may also include an index matching medium characterized by a refractive index that provides for reduced or minimal reflection or internal refraction of light emissions. In certain embodiments, elements 168, 169 may embody a single element, such as molded silicone. In certain embodiments, a thickness of each conformal layer 166 may be less than half the spacing between adjacent solid state emitter chips 165. In certain embodiments, spacing between solid state emitter chips 165 may be on the order of 10 to 75 micrometers, although larger spacing (up to 150 or even 500 micrometers) may also be used. In certain embodiments, the optical element 169 may include one or more functional materials, such as lumiphoric material, filtering material, and/or scattering material, which may be doped, coated, or otherwise provided in or on the optical element 169. Still referring to FIG. 20, the submount 161 (e.g., alumina, aluminum nitride, high temperature polymers, etc.) is covered with a pattern of metal (e.g., traces) 163 that may be used to interconnect the solid state emitter chips 165 and provide connection to a power supply (not shown). The metal pattern 163 includes connection pads 162 with insulating material 164 therebetween.

Figure 21:
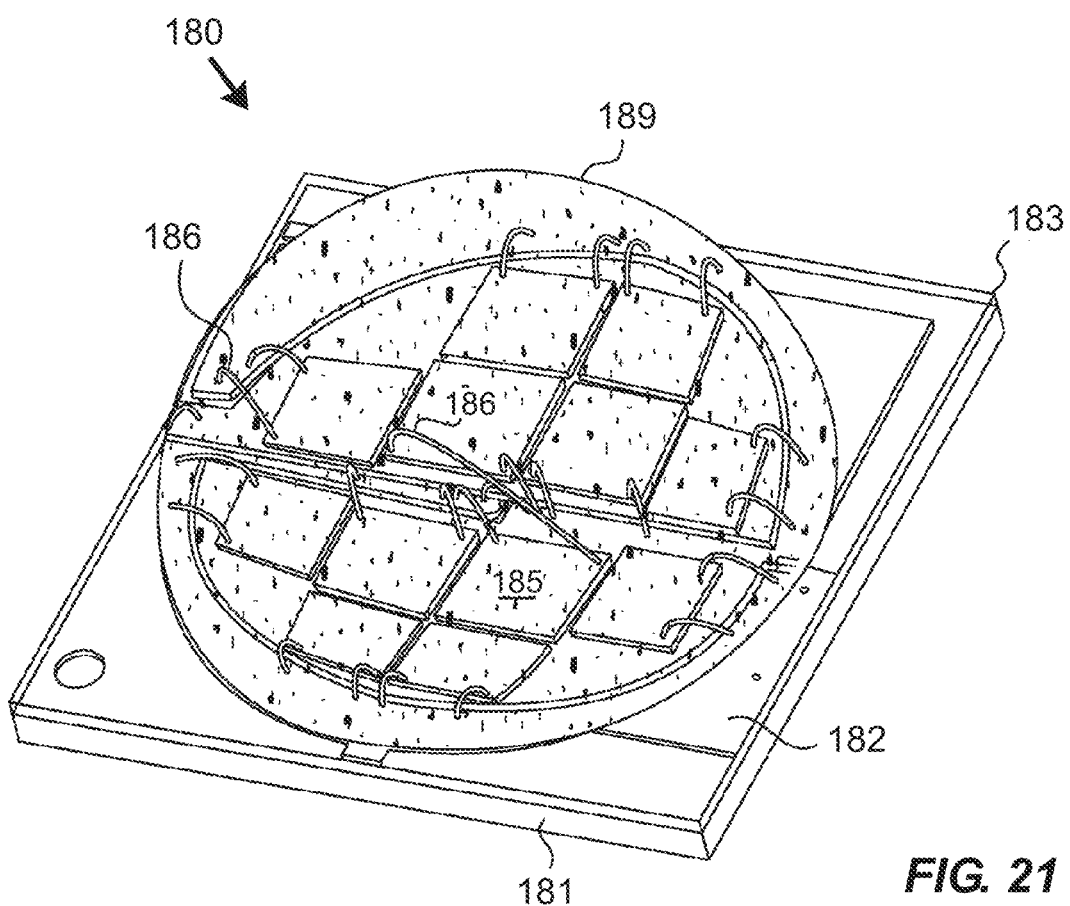
FIG. 21 is a perspective view of at least a portion of a solid state emitter package including multiple solid state emitter chips coated with multiple lumiphoric materials, with the chips coupled to electrical traces via wirebonds and arranged under a hemispherical optical element.
Figure 22A:
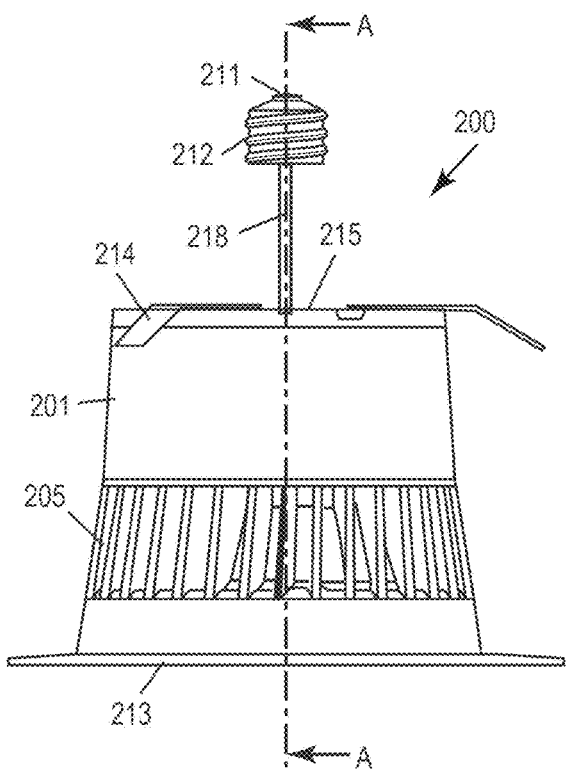
FIG. 22A is a side elevation view of a lighting device according to one embodiment of the disclosure embodied in a substantially cylindrical downlight intended for in-ceiling mounting and including multiple LEDs.
Figure 22B:
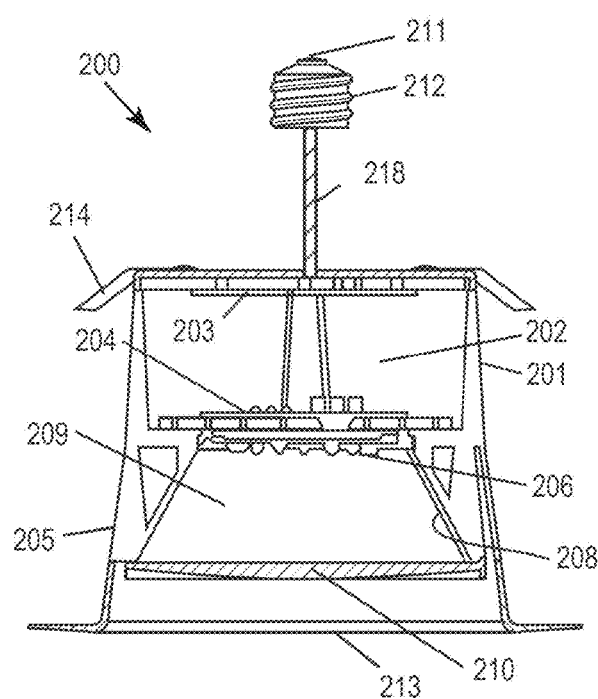
FIG. 22B is a cross-sectional view of the lighting device of FIG. 22A.
Figure 22C:
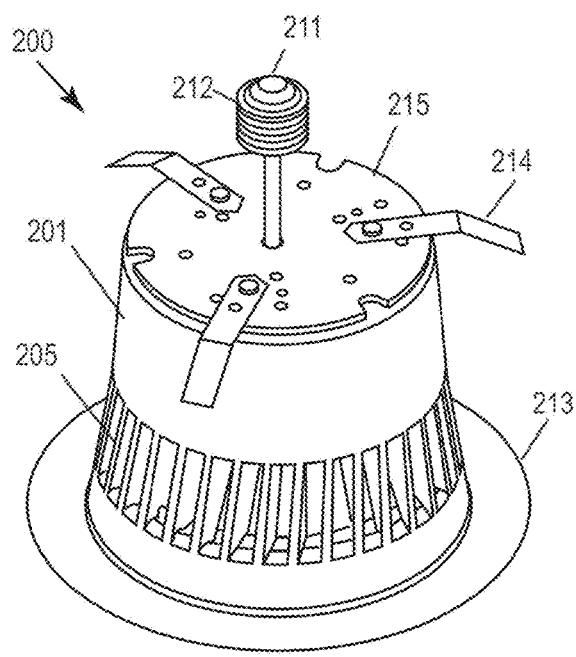
FIG. 22C is an upper perspective view of the lighting device of FIGS. 22A-22B.
Figure 22D:
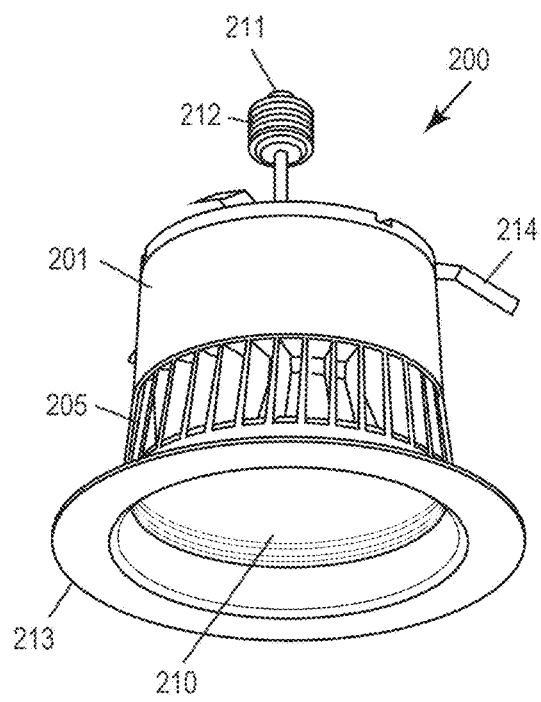
FIG. 22D is a lower perspective view of the lighting device of FIGS. 22A-22C.

FIG. 21 illustrates a solid state emitter package 180 including multiple solid state emitter (e.g., LED) chips 185 coupled to electrical traces or metal patterns 182 via wirebonds 186 and arranged under a hemispherical optical element (e.g., lens) 189. In certain embodiments, one or more LED chips 185 is coated with one or more lumiphoric material. As shown, twelve solid state emitter chips 185 are provided in contact with the electrical traces or metal patterns 182 arranged over submount 181, and cathodes of the LED chips are connected by wirebonds 186 to electrical traces or metal patterns 182. In certain embodiments, the optical element 189 may include one or more functional materials, such as lumiphoric material, notch filtering material, and/or scattering material, which may be doped, coated, or otherwise provided in or on the optical element 189. The solid state emitter chips 185 may be selected from various light color bins to provide a combined light output with appropriate color characteristics for a desired application. The unfiltered efficiency of such a solid state emitter package 180 with a warm white color may be on the order of 100 lm/W, prior to any filtering from the optical element; however, if the solid state emitter package 180 is binned for a cool white color, then an efficiency on the order of about 150 lm/W can be achieved (i.e., prior to any filtering).

FIGS. 22A-22D illustrate a lighting device according to one embodiment of the disclosure, embodied in a substantially cylindrical downlight 200 intended for in-ceiling mounting and including multiple LEDs as part of a LED module 206. The downlight 200 includes a generally cylindrical base housing 201 and a heatsink housing 205 that in combination form a body structure. Mounting elements 214 such as rotatable spring tabs are arranged along an upper surface 215 of the housing 201. A cable 218 extends between the base housing 201 and an Edison (screw-type) male connector forming a threaded lateral contact 212 and a foot contact 211. The base housing 201 defines an interior volume 202 containing printed circuit boards 203, 204 that include operative elements such a power converter, a controller module (e.g., including at least one processor and a memory), one or more transceivers (e.g., wireless transceivers), LED driver modules, sensor modules, detectors, voice recognition circuitry, and the like. The heatsink housing 205 defines an inner cavity 209 that includes a reflective surface and is further bounded by a light transmissive optical element such as a lens and/or a diffuser. A trim bezel 213 is arranged proximate to an open end of the heatsink housing. The downlight 200 may include any suitable features disclosed herein, and is preferably arranged to execute any one or more functions and/or method steps described herein.

Figure 23A:
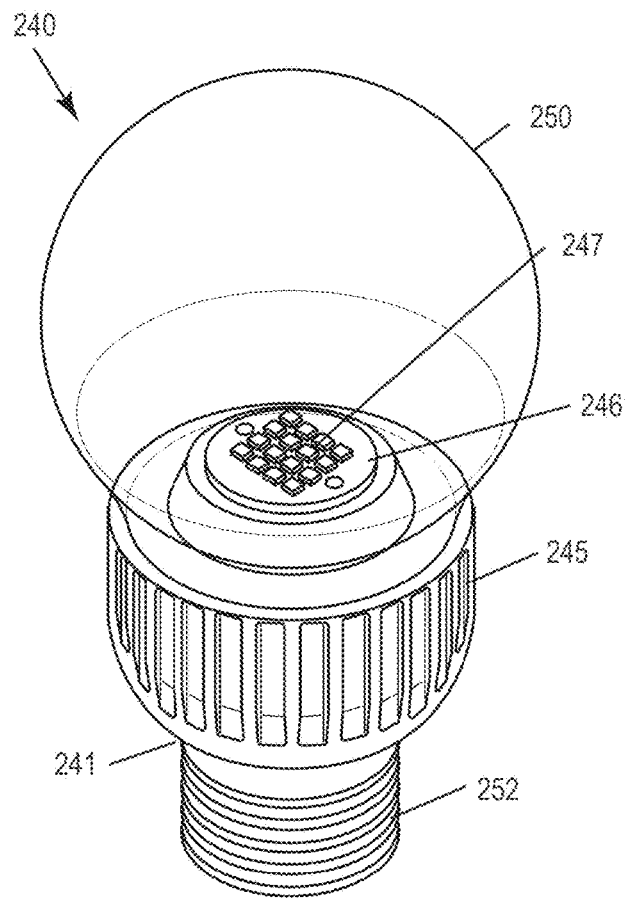
FIG. 23A is an upper perspective view of a light bulb including multiple LEDs arranged in a two-dimensional array according to one embodiment of the disclosure.
Figure 23B:
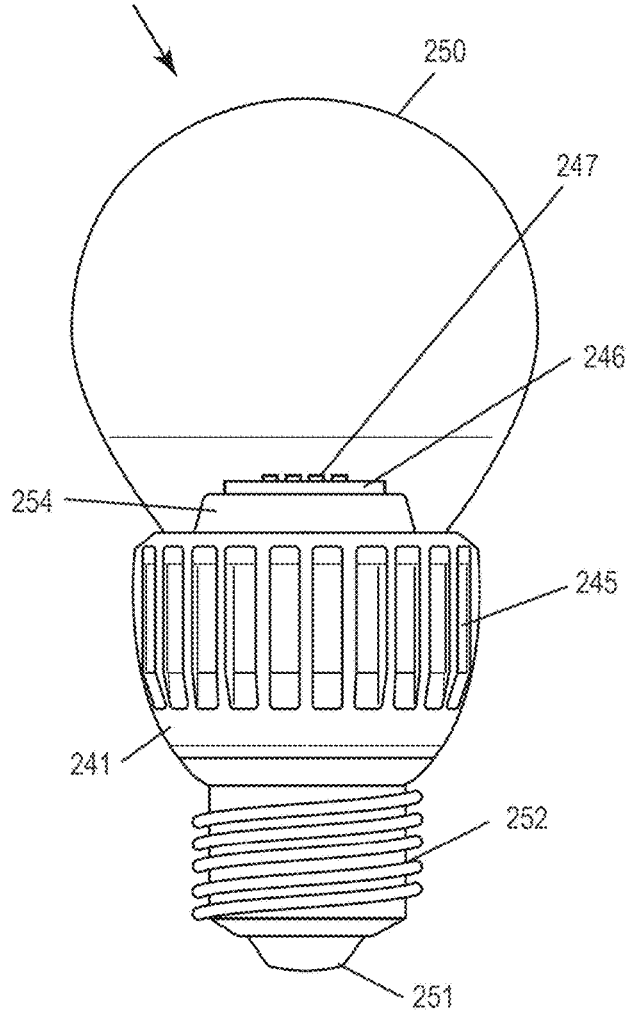
FIG. 23B is a side elevation view of the light bulb of FIG. 23A.

FIGS. 23A-23B illustrate a light bulb 240 including multiple LEDs 247 arranged in a two-dimensional array within a cavity bounded by a light transmissive globe or lens 250 according to one embodiment of the disclosure. Each LED 247 may have associated therewith multiple lumiphoric materials. The LEDs 247 are arranged on a single substantially planar emitter support surface 246, which may be elevated by a pedestal 254. The light bulb 240 includes a body structure 241 having an associated external heatsink 245. An Edison (screw-type) connector including a threaded lateral contact 252 and a foot contact 251 extend from one end of the body structure 241 opposing the globe 250. The body structure 241 defines an interior volume containing at least one printed circuit board (not shown) that includes operative elements such as a power converter, a controller module (e.g., including at least one processor and a memory), one or more transceivers (e.g., wireless transceivers), LED driver modules, sensor modules, detectors, voice recognition circuitry, and the like. The light bulb 240 may include any suitable features disclosed herein.

Figure 24A:
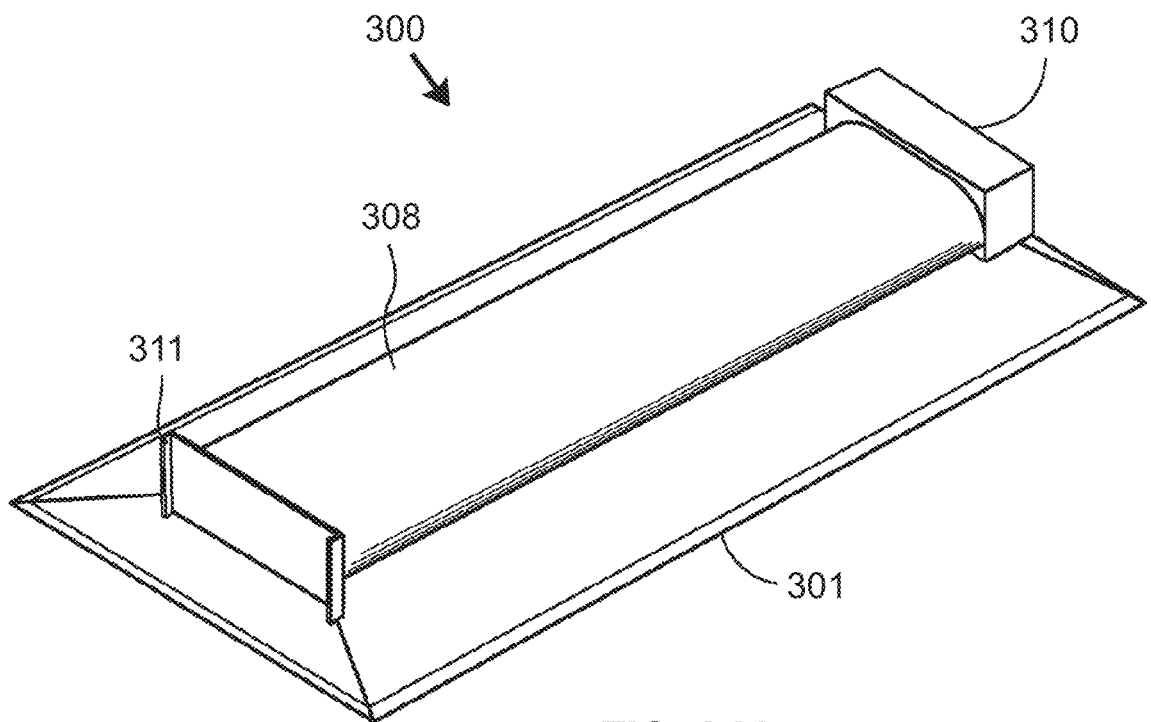
FIG. 24A is an upper perspective view of a troffer-type light fixture arranged to incorporate multiple solid state emitters as disclosed herein.
Figure 24B:
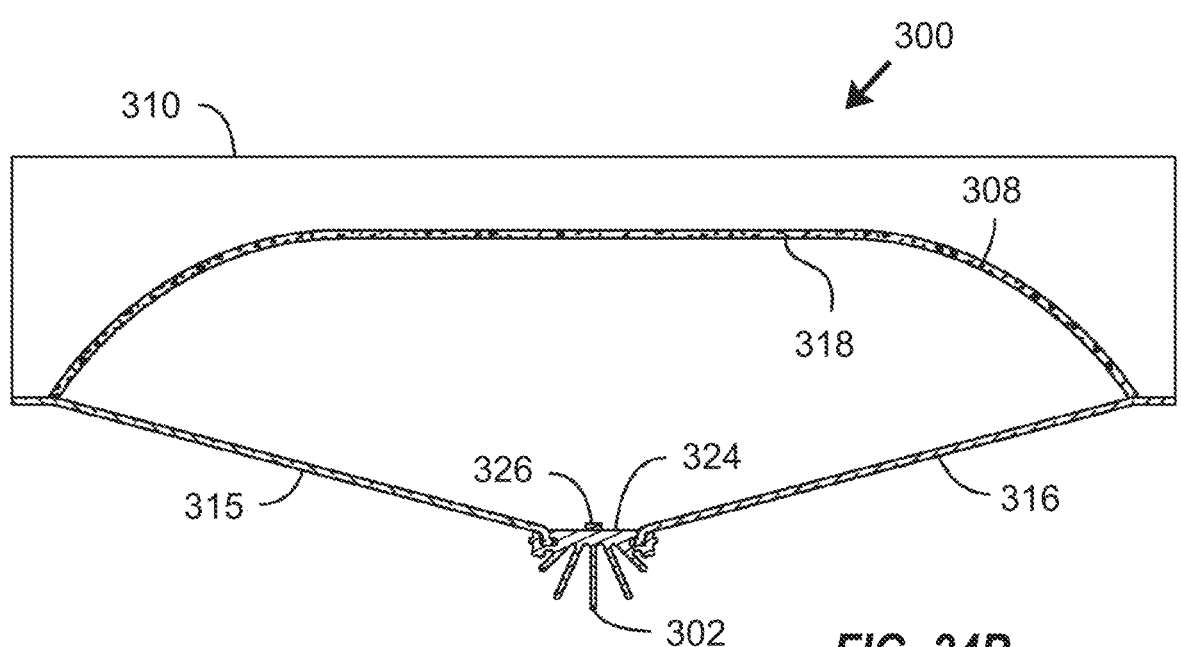
FIG. 24B is a side cross-sectional view of a portion of the light fixture of FIG. 24A.

FIGS. 24A-24B illustrate a troffer-type (in-ceiling linear) light fixture 300 arranged to incorporate multiple solid state emitters (e.g., LEDs) 326 as disclosed herein. In certain embodiments, one or more lumiphoric materials may be associated with one or more LEDs 326. Optionally, the light fixture 300 may include one or more notch filtering materials, such as may be associated with solid state emitters 326, may be applied to or included in a linear reflector (e.g., e.g., by doping, impregnation, coating, etc.), or may be applied to or integrated with one or more light transmissive lens plates 315, 316 to cause the light emitted from the light fixture 300 to exhibit a spectral notch. Light fixture 300 includes pan 301, heatsink 302, reflector 308, and end caps 310, 311. End cap 310 is larger than end cap 311 and is shaped to act as a circuit box to house electronics used to drive and control the light source (e.g., rectifiers, regulators, timing circuitry, etc.). The reflector 308 may include a diffusively reflective or specularly reflective surface 318. Although a reflector may take various shapes, in the illustrated embodiment, the reflector 308 includes a flat region 324 opposite the heatsink 302. In alternative embodiments, the reflector 308 could be parabolic in shape, or include two or more parabolic regions. Light fixture 300 also includes a diffuser lens assembly including lens plates 315, 316, disposed adjacent to sides of the heatsink 302.

Figure 25A:
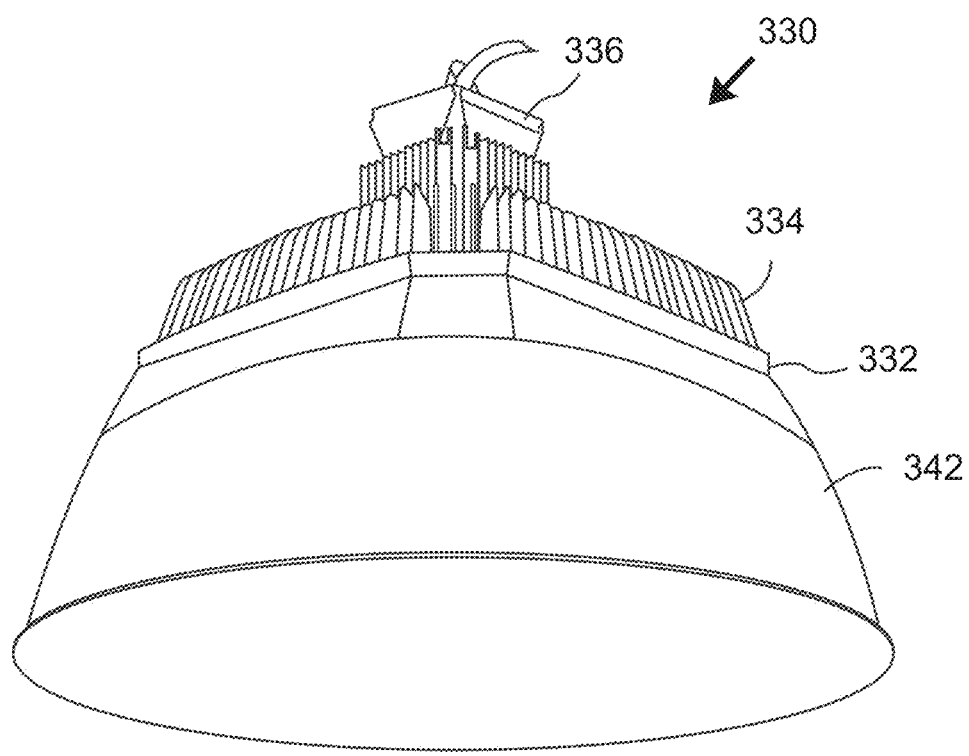
FIGS. 25A and 25B illustrate a high bay/low bay solid state lighting fixture including multiple solid state light emitters.
Figure 25B:
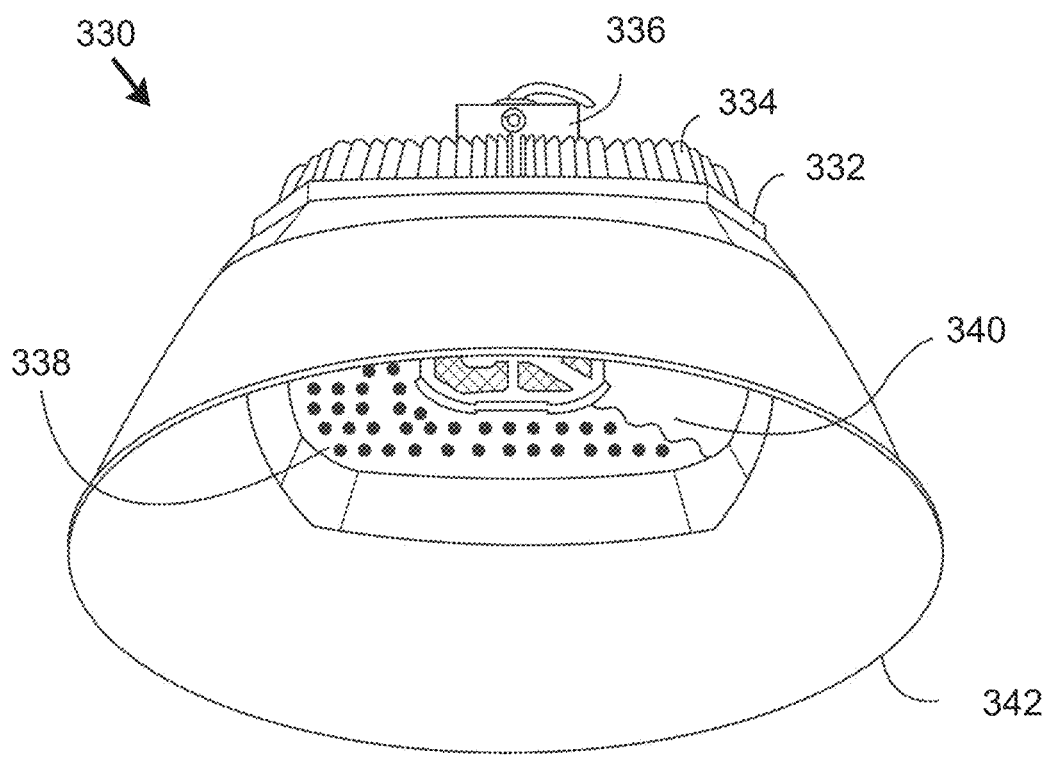

FIGS. 25A and 25B illustrate a high bay/low bay type solid state lighting fixture 330 including a frame 332 over which a heatsink 334 and an electronics housing 336 are mounted. An LED array 338 is mounted on a bottom side of the frame 332 and may be covered by a lens 340. As illustrated, a portion of the lens 340 is shown as being removed to expose the LED array 338. A reflector 342 may be provided around the LED array 338 to aid in directing and mixing light emitted from the LED array 338 for general illumination.

Figure 26A:
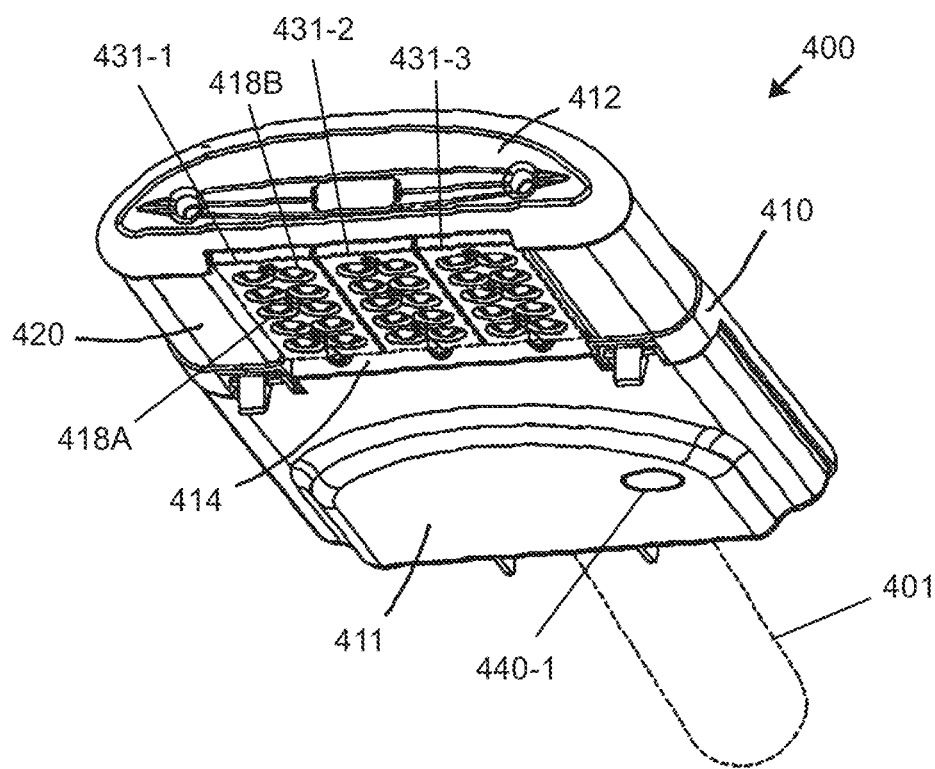
FIGS. 26A-26B illustrate a first outdoor floodlight fixture including multiple solid state light emitters.
Figure 26B:
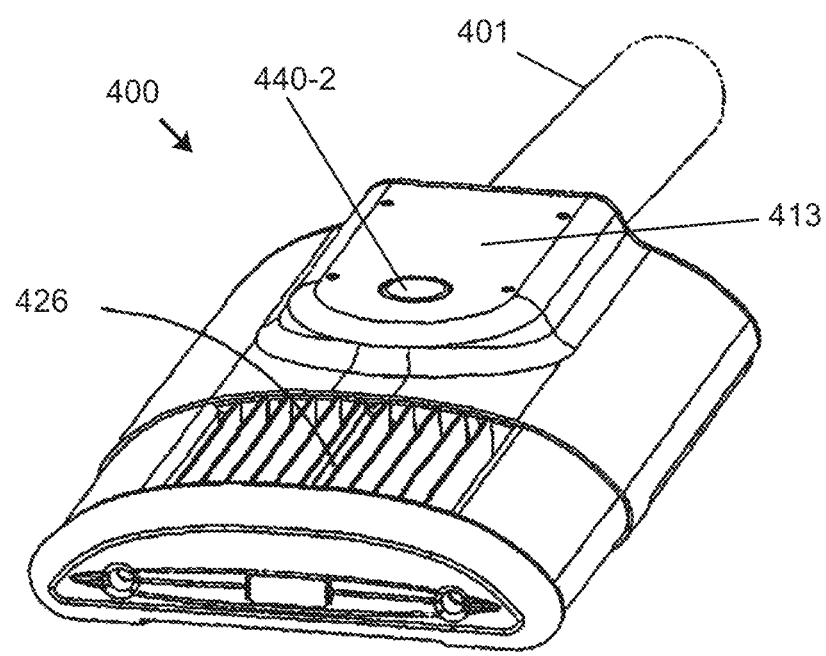

FIGS. 26A-26B illustrate a first outdoor floodlight (e.g., street or roadway lamp) 400 that may include multiple solid state light emitters as described herein. The floodlight 400 includes a housing 410 including a base portion 411 supported by an elongated pole 401 or other support. Multiple LEDs modules 431-1, 431-2, 431-3 each including multiple LEDs 418A, 418B arranged in an array are provided along a lower surface 420 of the floodlight 400 between the pole 401 and an end cap 412. The LED modules 431-1, 431-2, 431-3 are arranged proximate to an air gap 414 permitting heat to be dissipated to a heat spreader or heat sink 426 (arranged along an upper surface 413 of the housing 410) and transferred to an ambient environment. The floodlight 400 may include at least one receiver or sensor element 440-1, 440-2, which may embody any one or more of GPS receiver, a radio frequency receiver, an ambient light sensor, an image sensor, a temperature sensor, a motion sensor, a sound sensor, a timer, or the like.

Figure 27A:
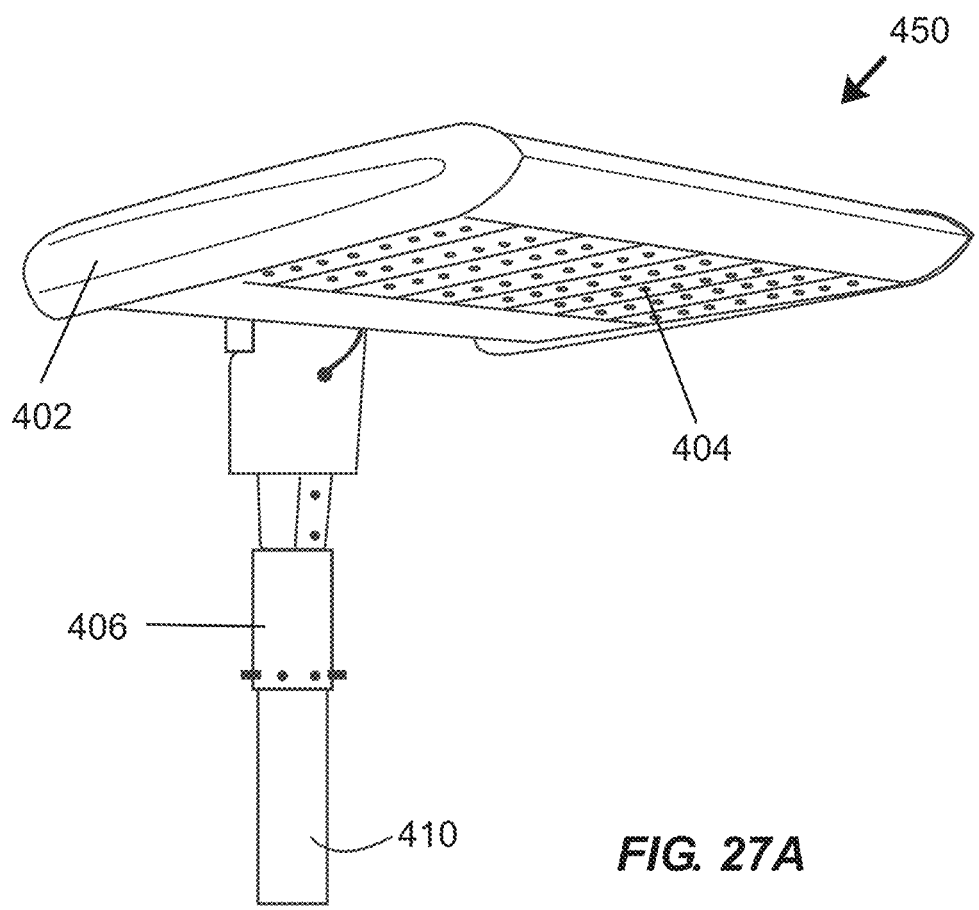
FIGS. 27A-27B illustrate a second outdoor floodlight fixture including multiple solid state light emitters.
Figure 27B:
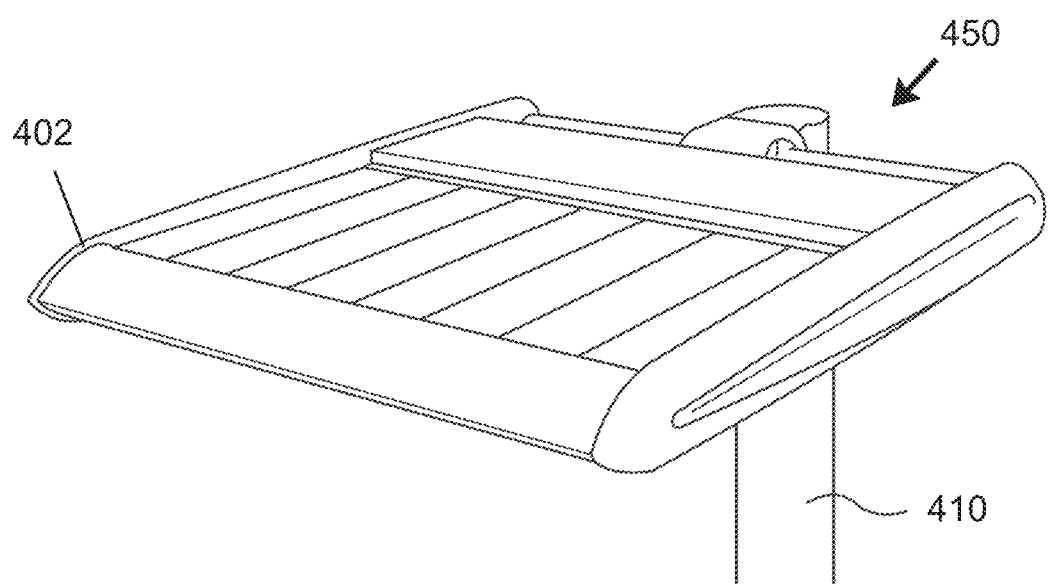

FIGS. 27A-27B illustrate a second outdoor floodlight fixture 450 including a body structure 402 housing an array of solid state light emitters 404 as disclosed herein. An interface structure 406 may be used to couple the floodlight fixture 450 to a pole 410. Outdoor light fixtures such as shown in FIGS. 27A-27B may be mounted to poles, tenons, or the like. The array of solid state light emitters 404 may be used to illuminate a desired environment, such as a roadway, a parking lot, a street, or the like.

Embodiments as disclosed herein may provide one or more of the following beneficial technical effects: enhancing perceived brightness of illumination provided by lighting devices while maintaining desirable color rendering characteristics; and reducing energy consumption required for light fixtures to provide equivalent perceived brightness levels.

Those skilled in the art will recognize improvements and modifications to the preferred embodiments of the present disclosure. All such improvements and modifications are considered within the scope of the concepts disclosed herein and the claims that follow.

What is claimed is:

1. A lighting device comprising:
    at least one electrically activated solid state light emitter arranged to generate emissions having a peak wavelength in a blue range; and
    first through third lumiphoric materials arranged to receive at least a portion of emissions of the at least one electrically activated solid state light emitter and configured to responsively generate lumiphor emissions;
    wherein:
        lumiphor emissions of the first lumiphoric material have a first peak wavelength in a range of from 485 nm to 530 nm;
        lumiphor emissions of the second lumiphoric material have a second peak wavelength in a range of from 575 nm to 612 nm;
        lumiphor emissions of the third lumiphoric material having a third peak wavelength in a range of from 605 nm to 640 nm, wherein the third peak wavelength corresponds to a third peak having a full width half maximum value of less than 60 nm;
        the lighting device is configured to produce aggregated emissions including emissions of the at least one electrically activated solid state light emitter, the first lumiphoric material, the second lumiphoric material, and the third lumiphoric material;
        the lighting device is configured to produce aggregated emissions having a CRI Ra value of at least 70; and
        the lighting device is configured to produce aggregated emissions having a spectral power distribution with a Melanopic/Photopic ratio (M/P ratio) value within a target range as a function of correlated color temperature (CCT) in Kelvin of the aggregated emissions, the target range including minimum values defined by a minimum value function in which M/P ratio equals $[-2.05 \times 10^{-8}(CCT)^2 + 2.72 \times 10^{-4}(CCT) - 0.1506]$, and the target range including maximum values defined by a maximum value function in which M/P ratio equals $[-2.57 \times 10^{-8}(CCT)^2 + 3.70 \times 10^{-4}(CCT) - 0.1889]$, and CCT being in a range of from 2000 to 7000 Kelvin.

2. The lighting device of claim 1, being configured to produce aggregated emissions having a spectral power distribution with a Melanopic/Photopic ratio (M/P ratio) value within a first target subrange as a function of CCT in Kelvin, the first target subrange including minimum values defined by a minimum value function in which M/P ratio equals $[1.1 \times (-2.05 \times 10^{-8}(CCT)^2 + 2.72 \times 10^{-4}(CCT) - 0.1506)]$, the first target subrange including maximum values defined by a maximum value function in which M/P ratio equals $[-2.57 \times 10^{-8}(CCT)^2 + 3.70 \times 10^{-4}(CCT) - 0.1889]$, and CCT being in a range of from 2000 to 7000 Kelvin.

3. The lighting device of claim 1, being configured to produce aggregated emissions having a spectral power distribution with a Melanopic/Photopic ratio (M/P ratio) value within a second target subrange as a function of CCT in Kelvin, the second target subrange including minimum values defined by a minimum value function in which M/P ratio equals $[1.25 \times (-2.05 \times 10^{-8}(CCT)^2 + 2.72 \times 10^{-4}(CCT) - 0.1506)]$, the second target subrange including maximum values defined by a maximum value function in which M/P ratio equals $[-2.57 \times 10^{-8}(CCT)^2 + 3.70 \times 10^{-4}(CCT) - 0.1889]$, and CCT being in a range of from 2000 to 7000 Kelvin.

4. The lighting device of claim 1, being configured to produce aggregated emissions having a CCT in a range of from 2000 to 6000 Kelvin.

5. The lighting device of claim 1, being configured to produce aggregated emissions defining a color point within a ±10 step MacAdam ellipse of a Planckian Locus on a CIE 1931 chromaticity diagram.

6. The lighting device of claim 1, being configured to produce aggregated emissions defining a color point within a ±7step MacAdam ellipse of a Planckian Locus on a CIE 1931 chromaticity diagram.

7. The lighting device of claim 1, wherein the at least one electrically activated solid state light emitter has a peak wavelength in a range of from 430 nm to 480 nm.

8. The lighting device of claim 1, wherein lumiphor emissions of the first lumiphoric material have a first peak wavelength in a subrange of from 485 nm to 505 nm.

9. The lighting device of claim 1, wherein lumiphor emissions of the second lumiphoric material have a second peak wavelength in a subrange of from 575 nm to 595 nm.

10. The lighting device of claim 1, wherein lumiphor emissions of the second lumiphoric material have a second peak wavelength in a subrange of from 580 nm to 590 nm.

11. The lighting device of claim 1, wherein the third peak wavelength corresponds to a third peak having a full width half maximum value of less than 35 nm.

12. The lighting device of claim 1, wherein the first peak wavelength corresponds to a third peak having a full width half maximum value of less than 60 nm.

13. The lighting device of claim 1, wherein lumiphor emissions of the third lumiphoric material have a third peak wavelength is in a subrange of from 610 nm to 625 nm.

14. The lighting device of claim 1, being configured to produce aggregated emissions having a CRI Ra value of at least 80.

15. The lighting device of claim 1, being configured to produce aggregated emissions having a CRI Ra value in a range of from 75 to 95.

16. The lighting device of claim 1, wherein the first through third lumiphoric materials are dispersed in a binder.

17. The lighting device of claim 1, wherein the first lumiphoric material is arranged in a first layer, the second lumiphoric material is arranged in a second layer, and the third lumiphoric material is arranged in a third layer.

18. A lighting device comprising:
at least one electrically activated solid state light emitter arranged to generate emissions having a peak wavelength in a blue range; and
at least one supplemental electrically activated solid state light emitter; and
a plurality of lumiphoric materials arranged to receive at least a portion of emissions of the at least one electrically activated solid state light emitter and configured to responsively generate lumiphor emissions;
wherein:
the lighting device is configured to produce aggregated emissions including emissions of the at least one electrically activated solid state light emitter, emissions of the at least one supplemental electrically activated solid state light emitter, and emissions of the plurality of lumiphoric materials;
the lighting device is configured to produce aggregated emissions including a first peak wavelength in a range of 430 nm to 480 nm, a second peak wavelength in a range of from 485 nm to 530 nm, a third peak wavelength in a range of from 575 nm to 612 nm, and a fourth peak wavelength in a range of from 605 nm to 640 nm, and the fourth peak wavelength corresponds to a peak having a full width half maximum value of less than 60 nm;
the lighting device is configured to produce aggregated emissions having a CRI Ra value of at least 70; and
the lighting device is configured to produce aggregated emissions having a spectral power distribution with a Melanopic/Photopic ratio (M/P ratio) value within a target range as a function of correlated color temperature (CCT) in Kelvin of the aggregated emissions, the target range including minimum values defined by a minimum value function in which M/P ratio equals $[-2.05 \times 10^{-8}(CCT)^2 + 2.72 \times 10^{-4}(CCT) - 0.1506]$, and the target range including maximum values defined by a maximum value function in which M/P ratio equals $[-2.57 \times 10^{-8}(CCT)^2 + 3.70 \times 10^4(CCT) - 0.1889]$, and CCT being in a range of from 2000 to 7000 Kelvin.

19. The lighting device of claim 18, wherein the at least one supplemental electrically activated solid state light emitter is configured to generate the second peak wavelength or the fourth peak wavelength.

20. The lighting device of claim 18, wherein the second peak wavelength is in a subrange of from 485 nm to 505 nm, and the third peak wavelength is in a subrange of from 575 nm to 595 nm.

* * * * *

UNITED STATES PATENT AND TRADEMARK OFFICE
CERTIFICATE OF CORRECTION

PATENT NO. : 10,529,900 B2  
APPLICATION NO. : 15/972152  
DATED : January 7, 2020  
INVENTOR(S) : Fan Zhang et al.

Page 1 of 1

It is certified that error appears in the above-identified patent and that said Letters Patent is hereby corrected as shown below:

In the Specification  
In Column 12, Line 22, replace "$(Ba,Sr)_2SiO_4:Eu^2$" with --$(Ba,Sr)_2SiO_4:Eu^{2+}$--.  
In Column 16, Line 15, replace "$V(I)_{10°}$" with --$V(l)_{10°}$--.  
In Column 18, Line 36, replace "data points din FIG. 9" with --data points d in FIG. 9--.

In the Claims  
In Claim 18, Column 28, Lines 27-28, replace "$[-2.57 \times 10^{-8}(CCT)^2 + 3.70 \times 10^4(CCT) - 0.1889]$" with --$[-2.57 \times 10^{-8}(CCT)^2 + 3.70 \times 10^{-4}(CCT) - 0.1889]$--.

Signed and Sealed this  
Twenty-fifth Day of February, 2020

Andrei Iancu  
*Director of the United States Patent and Trademark Office*